US008917888B2

(12) United States Patent
Nakamura

(10) Patent No.: US 8,917,888 B2
(45) Date of Patent: Dec. 23, 2014

(54) CONTROL TERMINAL APPARATUS AND CONTROL METHOD

(75) Inventor: Junichi Nakamura, Chiba (JP)

(73) Assignee: Sony Corporation, Tokyo (JP)

( * ) Notice: Subject to any disclaimer, the term of this patent is extended or adjusted under 35 U.S.C. 154(b) by 448 days.

(21) Appl. No.: 13/218,864

(22) Filed: Aug. 26, 2011

(65) Prior Publication Data

US 2012/0057725 A1 Mar. 8, 2012

(30) Foreign Application Priority Data

Sep. 3, 2010 (JP) ................................ 2010-197529

(51) Int. Cl.

| | |
|---|---|
| ***H03G 3/00*** | (2006.01) |
| ***H03G 9/00*** | (2006.01) |
| ***G06F 3/00*** | (2006.01) |
| ***H04H 60/04*** | (2008.01) |
| ***H04R 27/00*** | (2006.01) |
| ***H04R 29/00*** | (2006.01) |
| ***H04S 7/00*** | (2006.01) |

(52) U.S. Cl.

CPC ............... *H04H 60/04* (2013.01); *H04R 27/00* (2013.01); *H04R 29/008* (2013.01); *H04S 7/40* (2013.01); *H04R 2430/01* (2013.01); *H04R 2227/005* (2013.01)

USPC ........... 381/109; 381/102; 381/105; 381/107; 715/716

(58) Field of Classification Search

USPC ......... 381/80, 105, 106, 107, 109, 92, 95, 96, 381/104, 110–117, 122; 715/716; 323/352; 380/53

See application file for complete search history.

(56) References Cited

U.S. PATENT DOCUMENTS

| | | | | |
|---|---|---|---|---|
| 7,349,548 | B2 * | 3/2008 | Wang | 381/104 |
| 2003/0086579 | A1 | 5/2003 | Lashina et al. | |
| 2005/0054305 | A1 | 3/2005 | Hagiwara et al. | |
| 2006/0291666 | A1 | 12/2006 | Ball et al. | |
| 2008/0155416 | A1 * | 6/2008 | Oitaira | 715/716 |
| 2011/0311072 | A1 * | 12/2011 | Waller, Jr. | 381/80 |
| 2012/0051560 | A1 * | 3/2012 | Sanders | 381/105 |

FOREIGN PATENT DOCUMENTS

| | | | |
|---|---|---|---|
| DE | EP1079208 | A2 * | 2/2001 |
| EP | 1 079 208 | A2 | 2/2001 |
| JP | 4-81100 | | 3/1992 |
| JP | 2005-80265 | | 3/2005 |
| JP | 2006-339709 | | 12/2006 |
| JP | 2007-281687 | | 10/2007 |
| JP | 2009-218948 | | 9/2009 |
| WO | WO 03/036406 | A2 | 5/2003 |

OTHER PUBLICATIONS

Office Action issued Jan. 28, 2014 in Japanese Application No. 2010-197529.

Extended Search Report issued Dec. 9, 2011 in European Patent Application No. 11178406.2-1224.

* cited by examiner

*Primary Examiner* — Paul S Kim

*Assistant Examiner* — William A Jerez Lora

(74) *Attorney, Agent, or Firm* — Oblon, Spivak, McClelland, Maier & Neustadt, L.L.P.

(57) ABSTRACT

A control terminal apparatus includes a transmission unit transmitting a control signal to audio output apparatuses, a display unit, an operation detector detecting an operation associated with display content, and a controller displaying individual volume setting sections which correspond to the audio output apparatuses and which include operation members performing variable operations of volume settings while volume setting states are displayed, displaying a master volume setting section including an operation member performing collective variable operation while the volume balance of the audio output apparatuses is maintained, executing clear display of a setting changeable range in which the volume balance is maintained in the master volume setting section, generating, when the operation detector detects an operation performed on one of the individual volume setting sections or the master volume setting section, a control signal corresponding to content of the operation, and causing the transmission unit to transmit the control signal.

16 Claims, 18 Drawing Sheets

CONTROL TERMINAL APPARATUS AND CONTROL METHOD

BACKGROUND

The present disclosure relates to a control terminal apparatus and a control method capable of controlling volume setting states of a plurality of audio output apparatuses.

In a mixer apparatus which receives audio signals of a plurality of channels, for example, a technique of controlling a volume level after mixing while the balance among volumes of the channels is maintained by a master fader has been proposed as disclosed in Japanese Unexamined Patent Application Publication Nos. 2005-80265 and 2006-339709.

SUMMARY

However, a technique of appropriately controlling the volumes of the individual audio output apparatuses instead of the level of the volume obtained after mixing the volume signals of the channels by the mixer has not been developed.

For example, in a home network system, individual audio output apparatuses installed in respective rooms receive music content or the like delivered from a single source apparatus and individually reproduce and output the music content. By this, a situation in which the same music is played in the various rooms may be attained.

In such a system, the following situations are assumed.

Volumes of a plurality of audio output apparatuses are to be individually controlled.

Volumes of a plurality of audio output apparatuses are to be collectively controlled without deterioration of the balance among the volumes of the audio output apparatuses.

Volumes of a plurality of audio output apparatuses are to be collectively controlled while deterioration of the balance among volumes of the audio output apparatuses is accepted.

A volume control of a specific audio output apparatus is to be temporarily suppressed.

An output is to be temporarily stopped (muted) while a setting of a volume of a specific audio output is not changed.

Mute states of a plurality of audio output apparatuses are to be collectively cancelled.

In this disclosure, to address such situations, it is desirable to provide a control terminal apparatus and a control method capable of controlling volumes of a plurality of audio output apparatuses with ease.

Specifically, it is desirable to appropriately control volumes of a plurality of audio output apparatuses in an environment in which a mixer generally used for PA (public address) is not presence such as an environment of a home network system.

According to an embodiment of the present disclosure, there is provided a control terminal apparatus including a transmission unit configured to transmit and output a control signal to a plurality of audio output apparatuses, a display unit, an operation detector configured to detect an operation associated with display content in the display unit, and a controller. The controller causes the display unit to display individual volume setting sections which correspond to the audio output apparatuses and which include operation members capable of performing variable operations of volume settings while volume setting states are displayed and to display a master volume setting section including an operation member capable of performing collective variable operation in a state in which the balance of volumes of volume setting states of the audio output apparatuses is maintained, executes clear display of a setting changeable range in which the volume balance of the audio output apparatuses is maintained in the master volume setting section, generates, when the operation detector detects an operation performed on one of the individual volume setting sections or the master volume setting section, a control signal corresponding to content of the operation, and causes the transmission unit to transmit and output the control signal.

The controller may cause the transmission unit to transmit and output a control signal for changing the volume settings to the audio output apparatuses to control change of the volume settings in accordance with an operation performed on the operation member of the master volume setting section, and change display of the volume setting states of the individual volume setting sections corresponding to the audio output apparatuses to which the volumes are set by the operation.

Display of the setting changeable range in the master volume setting section may represent that the variable operation in the master volume setting section is available in a range in which the largest volume setting among the volume settings of the audio output apparatuses which are controlled in accordance with an operation performed on the master volume setting section does not exceed an upper limit of the setting changeable range and the smallest volume setting does not exceed a lower limit of the setting changeable range.

The controller may change the display of the setting changeable range in the master volume setting section in accordance with the variable operation of the volume settings performed on the individual volume setting sections.

The controller may control the master volume setting section so that the operation member of the master volume setting section is displayed at the center of the setting changeable range.

The controller may allow the operation member of the master volume setting section to be operated beyond the setting changeable range, and when a volume setting of one of the audio output apparatuses exceeds the upper limit or the lower limit of the setting changeable range, the volume setting may be maintained to be the upper limit or the lower limit, and the volume setting state of the corresponding one of the individual volume setting section may be maintained to be the upper limit or the lower limit of the setting changeable range, and on the other hand, control of change of volume settings may be performed on individual volume setting sections in which volume settings thereof have not reached the upper limit or the lower limit of the setting changeable range, and display of an audio setting state of a corresponding one of the volume setting units may be changed.

Alternatively, the controller may allow the operation member of the master volume setting section to be operated beyond the setting changeable range, and when a volume setting of one of the audio output apparatuses exceeds the upper limit or the lower limit of the setting changeable range, the volume setting may be maintained to be the upper limit or the lower limit, and a volume setting value of the corresponding one of the individual volume setting sections may be maintained to be a value which exceeds the setting changeable range in accordance with the operation while the volume setting state of the corresponding one of the individual volume setting sections is maintained to be the upper limit or the lower limit of the setting changeable range.

The controller may perform a process of prohibiting an operation performed on one of the operation members of the individual volume setting sections and the master volume setting section in accordance with a lock operation performed on the one of the individual volume setting sections and the master volume setting section.

When performing the prohibition process on some of the individual volume setting sections, the controller may cause the transmission unit to transmit and output a control signal for changing volume settings to audio output apparatuses corresponding to the other of the individual volume setting sections which have not been subjected to the prohibition process and change display of volume setting states of the individual volume setting sections which have not been subjected to the prohibition process.

The controller may cause the transmission unit to transmit and output, in accordance with a mute operation performed on at least one of the individual volume setting sections, a control signal for a mute instruction to at least one of the audio output apparatuses to be operated and display a mute state in the individual volume setting section.

The controller may cause the transmission unit to transmit and output, in accordance with a mute operation performed on the muster volume setting unit, a control signal for a mute instruction to all the audio output apparatuses and display mute states in the individual volume setting sections and the master volume setting section.

The controller may cause the transmission unit to transmit and output, in accordance with a mute cancel operation performed on at least one of the individual volume setting sections, a control signal for a mute cancel instruction to an audio output apparatus corresponding to the individual volume setting section and terminate display of mute states in the individual volume setting section and the master volume setting section.

The controller may cause the transmission unit to transmit and output, in accordance with a mute cancel operation performed on the master volume setting section, a control signal for a mute cancel instruction to all the audio output apparatuses and terminate the display of the mute states of all the individual volume setting section and the master volume setting section.

The controller may perform control such that the operation member is displayed so as to have a size corresponding to the setting changeable range so that the setting changeable range is clearly displayed.

The audio output apparatuses may be connected to a network including an audio source device and reproduce and output audio content delivered in common from the audio source device, and the transmission unit may transmit and output a control signal to the audio output apparatuses in communication through the network.

A control method is employed in a control terminal apparatus including a transmission unit configured to transmit and output a control signal to a plurality of audio output apparatuses, a display unit, and an operation detector configured to detect an operation associated with display content in the display unit. The control method includes displaying individual volume setting sections which correspond to the audio output apparatuses and which include operation members capable of performing variable operations of volume settings while volume setting states are displayed, displaying a master volume setting section including an operation member capable of performing collective variable operation in a state in which the balance of volumes of volume setting states of the audio output apparatuses is maintained, and executing clear display of a setting changeable range in which the volume balance of the audio output apparatuses is maintained in the master volume setting section, and generating, when the operation detector detects an operation performed on one of the individual volume setting sections or the master volume setting section, a control signal corresponding to content of the operation, and causing the transmission unit to transmit and output the control signal.

According to the present disclosure, in the display unit of the control terminal apparatus, the plurality of individual volume setting sections corresponding to the plurality of audio output apparatuses on the network and the single master volume setting section are displayed The user may perform an operation of turning up and down the volumes of the audio output apparatuses by operations performed on the individual volume setting sections. Furthermore, the user may perform an operation of turning up and down the volumes of the audio output apparatuses while the volume balance of the audio output apparatuses is maintained by an operation performed on the master volume setting section.

Here, by performing clear display of the setting changeable range in the master volume setting section, the user may recognize an operation available range of the master volume setting section in a range in which the volume balance of the audio output apparatuses is not deteriorated.

Note that the operation member of the master volume setting section may be operated within the setting changeable range or may be operated beyond the setting changeable range when the operation is enabled while the deterioration of the volume balance may be accepted.

According to the present disclosure, individual volume operations and a collective volume operation may be easily performed on a plurality of audio output apparatuses on a network using a control terminal apparatus. In particular, the collective volume operation may be performed by operating a master volume setting section while the volume balance of the audio output apparatuses is maintained. Furthermore, a user may recognize a range in which the collective volume operation may be executed while the volume balance is maintained by clearly representing a setting changeable range and the user is prompted to perform an appropriate operation.

DETAILED DESCRIPTION OF EMBODIMENTS

Hereinafter, an embodiment of the present disclosure will be described in the following order.

Figure 1:
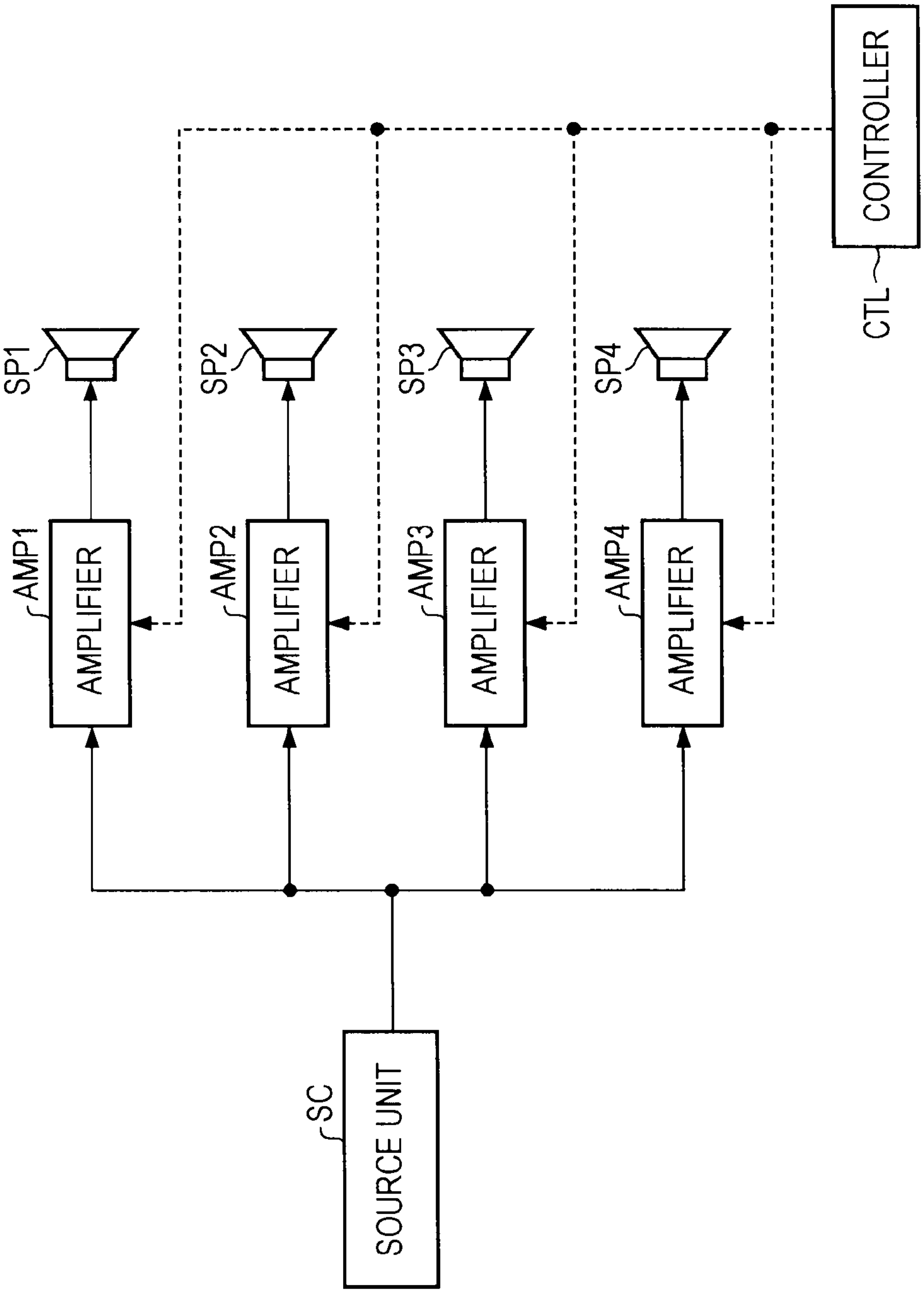
FIG. 1 is a block diagram illustrating a basic configuration of an embodiment of the present disclosure.

1. Basic Configuration
2. Home Network System
3. Configurations of Apparatuses
3-1. Reproducing Apparatus
3-2. Network Speaker
3-3. Remote Controller
4. Operation using Volume Operation Display
5. Knob Lock Operation
6. Mute Operation
7. Operation of Exceeding Setting Changeable Range
8. Processing Example
9. Modifications 1. Basic Configuration FIG. 1 is a diagram illustrating a basic system configuration according to the embodiment of the present disclosure.

Here, an apparatus which outputs music content or the like is shown as a source unit SC. The music content or the like output from the source unit SC is supplied to amplifiers AMP1 to AMP4.

The amplifiers AMP1 to AMP4 output the received music content from speakers SP1 to SP4 as audio.

The amplifiers AMP1 to AMP4 are subjected to volume control by a controller CTL. A user may individually perform volume control on the amplifiers AMP1 to AMP4 or may collectively perform volume control on the amplifiers AMP1 to AMP4 by operating the controller CTL.

Specifically, when the volume control is collectively performed, settings of volumes of the amplifiers AMP1 to AMP4 may be changed while the balance among the volumes of the amplifiers AMP1 to AMP4 is maintained.

For example, in an example of a home network system (domestic network) which will be described hereinafter, the amplifiers AMP1 to AMP4 shown in FIG. 1 may serve as individual audio output apparatuses installed in different rooms.

The user desires different appropriate volumes for music or the like in the different rooms depending on sizes of the rooms, performance of speakers, installation positions, and settings of atmosphere of the rooms.

Therefore, the amplifiers AMP1 to AMP4 should have different volume settings. Furthermore, in such a state in which the volumes are individually set, the volumes of the amplifiers AMP1 to AMP4 may be collectively turned up or down while the relative balance among the volumes of the amplifiers AMP1 to AMP4 is maintained.

In this embodiment, an operation method which satisfies desire of a user described above is provided using a device corresponding to the controller CTL in an environment in which the same music or the like is simultaneously output from a plurality of audio output apparatuses.

2. Home Network System

For example, a configuration of a home network system serving as an actual mode of the basic configuration shown in FIG. 1 will be described.

Figure 2:
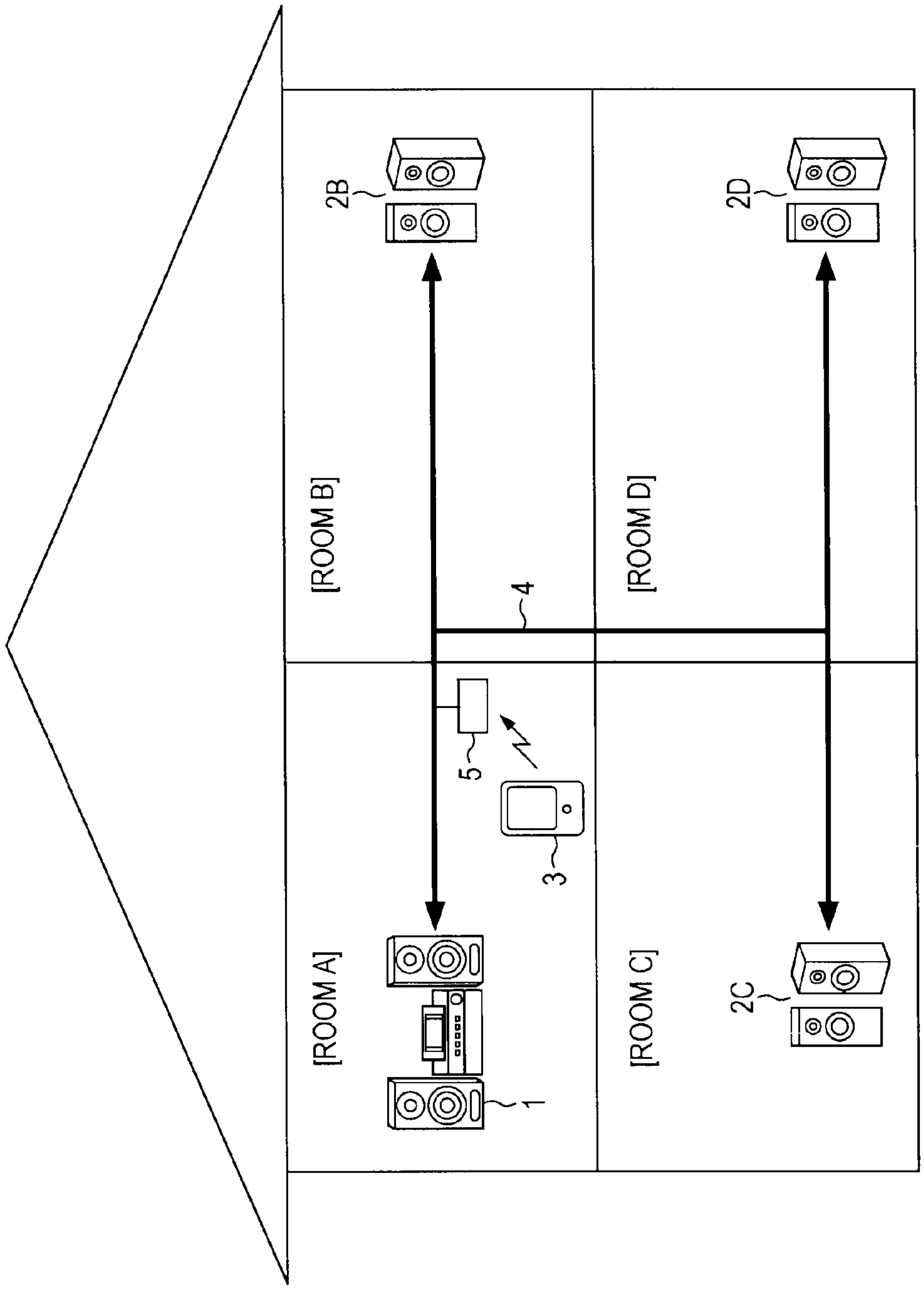
FIG. 2 is an explanatory diagram illustrating a home network system according to the embodiment.

FIG. 2 shows an example in which a home network system is used in four rooms, i.e., rooms A, B, C, and D at a certain home.

Although the term "home network system" is used herein, a location where the system of this example is used is not limited to a "home". For example, the system may be used in companies, schools, and public facilities. Furthermore, in addition to "rooms" in the same building, outside areas or other buildings on the same site such a garden, a garage, and a storage may be included in the "rooms". Specifically, in this example, an electronic apparatus installed in a certain room delivers the same music content or the same video content to other electronic apparatuses serving as servers so that the music content or the video content may be viewed in the individual "rooms". However, the same content may be delivered to various types of "rooms". Note that, in this example, it should be considered that the delivery is appropriately performed within a narrow space to some extent instead of a wide space delivery performed in a public network such as the Internet.

Note that the system performs delivery of music content in a description of the embodiment.

In the home network system of this embodiment, various electronic apparatuses installed in different rooms are communicated with one another through a communication network (network) 4.

In FIG. 2, a comparatively simple example is shown.

In the example shown in FIG. 2, a reproducing apparatus 1 is installed in the room A.

Furthermore, a network speaker 2B is installed in the room B.

Furthermore, a network speaker 2C is installed in the room C.

Furthermore, a network speaker 2D is installed in the room D.

Moreover, a remote controller 3 having a display function and a touch panel function is installed in the room A.

For example, the remote controller 3 communicates with various apparatuses on the network 4 through an access point 5 which allows wireless communication or wired communication to be performed to transmit a control command, obtain information on the various apparatuses such as information on volume settings of the various apparatuses, and the like.

A user may perform volume control of the apparatuses installed in the rooms A to D using the remote controller 3.

Note that a location where the access point 5 is installed is not limited to the room A. Furthermore, when a communication range between the access point 5 and the remote controller 3 is large, the apparatuses may be operated using the remote controller 3 from any room. Alternatively, the access point 5 may be installed in each of the rooms.

Furthermore, the remote controller 3 may serve as an input apparatus for the reproducing apparatus 1, transmit a control command to the reproducing apparatus 1, and transmit a control command to the other apparatuses on the network 4 through the reproducing apparatus 1.

The reproducing apparatus 1 includes a reproducing unit and a speaker unit for reproducing music content, for example, and independently reproduces music or the like.

The reproducing apparatus 1 reproduces content data from an exchangeable optical disc player or the like which includes a hard disk drive (HDD), a flash memory, a plurality of optical discs such as a CD (Compact Disc), a DVD (Digital Versatile Disc), a BD (Blu-ray Disc (registered trademark)), and the like.

Then, the reproducing apparatus 1 outputs the reproduced music content data from an incorporated speaker, a connected speaker, or the like.

Meanwhile, the reproducing apparatus 1 functions as a server apparatus since the reproducing apparatus 1 may communicate with the other apparatuses through the network 4. That is, the reproducing apparatus 1 may function as a server apparatus which delivers the reproduced music content data to the other apparatuses (the network speakers 2B, 2C, and 2D) on the network 4.

The network speakers 2B, 2C, and 2D are audio output apparatuses which include amplifiers and speaker units. Particularly, the network speakers 2B, 2C, and 2D have a network communication function, and therefore, function as client apparatuses in the system.

For example, when the reproducing apparatus 1 serves as a server in the system, the network speakers 2B, 2C, and 2D receive music content delivered from the reproducing apparatus 1 and output the music content as music.

The network 4 includes a wired or wireless communication path used for communication at home, for example.

Examples of the wired communication path include a lamp line, an RF cable for television sets, DLNA (Digital Living Network Alliance), and an HDMI (High Definition Multimedia Interface). Furthermore, examples of the wireless communication path include a wireless LAN (IEEE802.11x (=a, b, g, n, and so on)), Blue tooth, and other communication methods using 2.4 GHz band.

In this embodiment, a case where the reproducing apparatus 1 serving as a server simultaneously delivers music content to the other client apparatuses (network speakers 2B, 2C, and 2D) which simultaneously reproduce the music content in the home network system will be described as a system operation. This operation corresponds to a so-called party mode in the home network.

Note that each of the apparatuses (that is, the reproducing apparatus 1 and the network speakers 2B, 2C, and 2D) recognizes the rooms where the other apparatuses are installed. For example, the reproducing apparatus 1 recognizes that the network speaker 2B is installed in the room B.

The recognition is enabled since the user sets the rooms (zone) of the individual apparatuses when the apparatuses are installed.

Furthermore, the apparatuses disposed on the network 4 are registered in the remote controller 3 which includes GUIs (Graphic User Interfaces) which are operable using a touch panel in advance.

Here, the correspondence relationship between the basic configuration shown in FIG. 1 and the home network system will be described as below.

Figure 3:
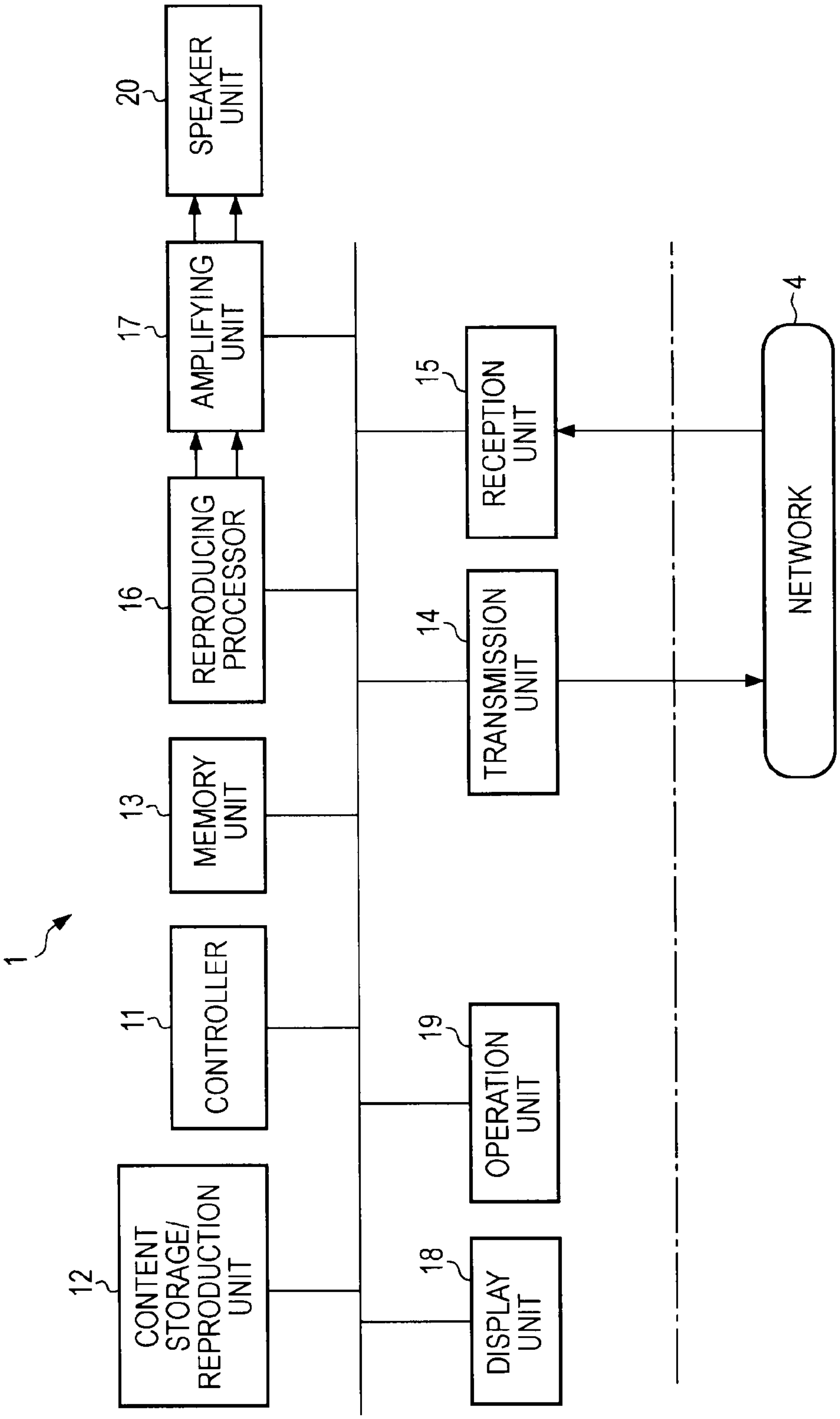
FIG. 3 is a block diagram illustrating a reproducing apparatus according to the embodiment.

For example the source unit SC corresponds to the reproducing apparatus 1 serving as the server. The amplifier AMP1 and the speaker SP1 correspond to an audio output system included in the reproducing apparatus 1 (i.e., a reproducing processor 16, an amplifying unit 17, and a speaker unit 20 shown in FIG. 3).

The amplifier AMP2 and a speaker SP2 correspond to the network speaker 2B.

The amplifier AMP3 and a speaker SP3 correspond to the network speaker 2C.

The amplifier AMP4 and a speaker SP4 correspond to the network speaker 2D.

The controller CTL corresponds to the remote controller 3.

It is apparent that various configurations of the home network system may be made. For example, a plurality of reproducing apparatuses functioning as servers and client apparatuses may be installed or an apparatus functioning as a dedicated server may be installed. Note that various apparatuses may be installed in a more number of rooms.

Accordingly, it is apparent that the configurations shown in FIGS. 1 and 2 are merely examples.

The remote controller 3 controls output volumes of the plurality of audio output apparatus in accordance with a user's operation. The plurality of audio output apparatuses to be controlled correspond to the amplifiers AMP1 to AMP4 shown in FIG. 1, and accordingly, the audio output apparatuses correspond to the reproducing apparatus 1 and the network speakers 2B, 2C, and 2D shown in FIG. 2.

Then, use of the remote controller 3 enables the user to execute operations for the following cases when the same music content or the like is to be output from the audio output apparatuses (the reproducing apparatus 1 and the network speakers 2B, 2C, and 2D) in a synchronization manner.

The audio volumes of the reproducing apparatus 1 and the network speakers 2B, 2C, and 2D are to be individually controlled.

The audio volumes of the reproducing apparatus 1 and the network speakers 2B, 2C, and 2D are to be collectively controlled without deteriorating the balance among the audio volumes of the apparatuses.

The audio volumes of the reproducing apparatus 1 and the network speakers 2B, 2C, and 2D are to be collectively controlled while deterioration of the balance among volumes of the audio output apparatuses is accepted.

Control of a volume of a specific one of the reproducing apparatus 1 and the network speakers 2B, 2C, and 2D is to be temporarily stopped (inoperable).

An output of a specific one of the reproducing apparatus 1 and the network speakers 2B, 2C, and 2D is to be temporarily stopped (muted) while a volume setting thereof is not changed.

Cancel of mute is to be collectively performed on the reproducing apparatus 1 and the network speakers 2B, 2C, and 2D which have been muted.

3. Configuration of Apparatuses 3-1: Reproducing Apparatus

Examples of configurations of the apparatuses connected to the network 4 will be described. First, an example of a configuration of the reproducing apparatus 1 will be described with reference to FIG. 3.

The reproducing apparatus 1 includes a controller 11, a content storage/reproduction unit 12, a memory unit 13, a transmission unit 14, a reception unit 15, the reproducing processor 16, the amplifying unit 17, a display unit 18, a panel operation unit 19, and the speaker unit 20.

The controller 11 has a microcomputer including a CPU (Central Processing Unit), a ROM (Read Only Memory), and a RAM (Random Access Memory).

The ROM included in the controller 11 stores programs to be executed by the CPU, for example, and various setting information used for a reproducing operation, a network communication operation, and the like. The RAM serves as a main storage apparatus unit for the CPU.

When the reproducing apparatus 1 solely performs a reproducing operation, when the reproducing apparatus 1 functions as a server apparatus, and when the reproducing apparatus 1 functions as a client apparatus, the controller 11 controls the entire reproducing apparatus 1 so that the reproducing apparatus 1 executes appropriate operations.

For example, the controller 11 controls a reproducing operation performed by the content storage/reproduction unit 12 and a communication operation performed by the transmission unit 14 and the reception unit 15.

The memory unit 13 integrally represents a storage unit such as a RAM, a ROM, and a flash memory. The memory unit 13 may be used as a work area for processes performed by the reproducing apparatus 1 and a storage area for storing programs. Furthermore, the memory unit 13 may be used to store various setting information, parameters, and the like used for a delivery operation.

Moreover, the memory unit 13 is used as a transmission buffer for content data which is reproduced by the content storage/reproduction unit 12 and which is used when the reproducing apparatus 1 functioning as a server apparatus performs delivery. Alternatively, the memory unit 13 is used as a reception buffer for content data which is used when the reproducing apparatus 1 functions as a client apparatus.

The content storage/reproduction unit 12 is an apparatus unit capable of reproducing various content data. The content data is stored in a hard disk, a flash memory, an optical disc, or the like. The content storage/reproduction unit 12 reproduces the content data from such a storage medium in response to an instruction issued by the controller 11. Accordingly, the content storage/reproduction unit 12 is realized as an HDD, a flash memory player, an optical disc player, or an exchange-type optical disc player.

The transmission unit 14 and the reception unit 15 function as a communication unit which communicates with other apparatuses through the network 4.

When the reproducing apparatus 1 functions as a server apparatus, the transmission unit 14 performs predetermined encoding on content data reproduced by the content storage/reproduction unit 12 under control of the controller 11 and performs network transmission, that is, delivery to the network speakers 2B, 2C, and 2D serving as client apparatuses.

The reception unit 15 receives information transmitted from the other apparatuses on the network 4. When receiving a control command from the remote controller 3, the reception unit 15 decodes a signal of the control command and transmits content of reception information to the controller 11.

Furthermore, although another server apparatus is not shown in FIG. 2, another server apparatus may be connected and the reproducing apparatus 1 may functions as a client apparatus. In this case, the reception unit 15 receives a signal transmitted from the server apparatus, that is, delivered content data or various instruction signals. Then, the reception unit 15 decodes the received signal. When receiving the delivered content data, the reception unit 15 transmits the content data (stream data) which has been decoded in accordance with a certain communication method to the memory unit 13, for example, under control of the controller 11, and the content data is buffered.

To perform such a process, for example, the transmission unit 14 and the reception unit 15 perform encoding, decoding, and a transmission/reception process in accordance with a wired communication method or a wireless communication method of the network 4.

The reproducing processor 16 performs a reproducing/outputting process on content data reproduced by the content storage/reproduction unit 12 or content data received through delivery.

When music content or the like is simultaneously reproduced by the audio output apparatuses in the system shown in FIG. 2, the controller 11 causes the transmission unit 14 to deliver content data reproduced by the content storage/reproduction unit 12 to the network speakers 2B, 2C, and 2D, and in addition, the controller 11 causes the reproducing apparatus 1 to reproduce and output the content data. In this case, the controller 11 causes the content storage/reproduction unit 12 to transmit the reproduced content data to the reproducing processor 16 which executes a reproduction output process.

The reproducing processor 16 performs a process for output on the content data, such as decoding against a compression process and error correction, and supplies an audio signal (such as a stereo audio signal of L and R channels) to the amplifying unit 17.

The amplifying unit 17 performs volume control, equalizing, a D/A conversion process, and the like, and supplies the audio signal to the speaker unit 20 which executes output of music or the like.

The controller 11 causes the amplifying unit 17 to perform the volume control in response to a control command supplied from the remote controller 3, for example.

Note that, in this example, only an audio output system including the amplifying unit 17 and the speaker unit 20 as output devices is shown, video content may be simultaneously reproduced in the home network system. In this case, a monitor display apparatus is provided as an output device, for example.

Furthermore, the speaker unit 20 and the monitor display apparatus serving as an output device may be integrally included in a case as the reproducing apparatus 1, or may be provided as independent apparatuses.

The display unit 18 is a small display panel disposed on the case of the reproducing apparatus 1, for example, and performs display of an operation state, display of a menu, display of icons, display of the equalizer, display of a title, display of messages, and the like under control of the controller 11. The display unit 18 includes a liquid crystal panel or an organic EL panel, for example.

Note that the display may be performed using a monitor display apparatus connected as an output device, and in this case, the display unit 18 might not be necessary.

The panel operation unit 19 collectively represents operation members such as an operation key and a jog dial disposed on the case of the reproducing apparatus 1. Note that, when the display unit 18 or the monitor display apparatus connected as an output device allows input using a touch panel, a mechanism of the touch panel is also included in the operation unit 19.

Furthermore, although not shown, when a dedicated remote controller is provided for the reproducing apparatus 1, a reception unit (for example, an infrared reception unit, an electric wave reception unit, or a wired connection reception unit) which receives a control signal supplied from the remote controller is also included in the operation unit 19.

The user may perform various operation inputs by operating an operation member included in the panel operation unit 19, by operating the touch panel on the menu display or the icon display in the display unit 18 (or the monitor display apparatus), and by operating a dedicated remote commander.

The controller 11 performs operation control and setting processes in the reproducing apparatus 1 and performs a process of signal transmission from the transmission unit 14 to the other apparatuses.

In addition to such user's operations, in this embodiment, the user may operate an output volume setting of the reproducing apparatus 1 using the remote controller 3.

Note that the configuration of the reproducing apparatus 1 described above is merely an example.

3-2: Network Speaker

An example of a network speaker 2 (2B, 2C, and 2D) will now be described with reference to FIG. 4.

The network speaker 2 includes a controller 21, a reproducing processor 22, a memory unit 23, a transmission unit 24, a reception unit 25, an amplifying unit 26, and a speaker unit 27.

The controller 21 includes a microcomputer including a CPU, a ROM, a RAM, and the like.

The ROM included in the controller 21 stores programs to be executed by the CPU, for example, and various setting information used for an operation of reproducing delivered content, an operation of communicating with other apparatuses, and the like. The RAM functions as a main storage apparatus unit for the CPU.

The controller 21 controls operation of the network speaker 2 so that the network speaker 2 functions as a client apparatus. Specifically, the controller 21 performs control of a reception of delivered content data and a control command and a process performed in accordance with the control command.

The memory unit 23 collectively represents a storage unit including a RAM, a ROM, and a flash memory. The memory unit 23 may be used as a work area for a process performed by the controller 21 or may be used as a storage area which stores programs. Furthermore, the memory unit 23 is also used to store various setting information, parameters, and the like used for a reproducing operation and a communication operation.

Furthermore, the memory unit 23 is used as a buffer memory for received content data.

The transmission unit 24 and the reception unit 25 function as a communication unit which communicates with the other apparatuses through the network 4.

The reception unit 25 receives a signal transmitted from the reproducing apparatus 1, that is, delivered content data or a control commend. Then, the reception unit 25 decodes the received signal. When receiving the delivered content data, the reception unit 25 transmits the content data (stream data) which has been decoded in accordance with a certain communication method to the memory unit 23 under control of the controller 21, and the content data is buffered.

Furthermore, when receiving the control command from the remote controller 3, the reception unit 25 decodes a signal of the control command and transmits content of reception information to the controller 21.

The transmission unit 24 performs encoding on a signal to be transmitted to another apparatus under control of the controller 21 and performs transmission output to the network 4.

Since the process described above is performed, the transmission unit 24 and the reception unit 25 perform encoding, decoding, and a transmission/reception process in accordance with a wired or wireless communication method through the network 4.

The reproducing processor 22 performs a process for reproduction and output of received content data using the speaker unit 27. For example, the received content data is buffered in the memory unit 23, and data included in the buffered content data is appropriately transmitted to the reproducing processor 22 at predetermined timings. The reproducing processor 22 performs a process for output on the content data, such as decoding against a compression process and error correction, and supplies an audio signal (such as a stereo audio signal of L and R channels) to the amplifying unit 26.

The amplifying unit 26 performs volume control, equalizing, a D/A conversion process, and the like, and supplies the audio signal to the speaker unit 27 which executes output of music or the like.

In this way, the speaker unit 27 outputs audio such as delivered music content and the user listen to the music.

The controller 21 causes the amplifying unit 26 to perform volume control in response to a control command supplied from the remote controller 3, for example.

Note that the speaker unit 27 may be integrally disposed on the case as the network speaker 2 or may be provided as an independent apparatus. Particularly, when an LR channel speaker is provided as a stereo speaker, at least a speaker unit is separately configured.

Figure 4:
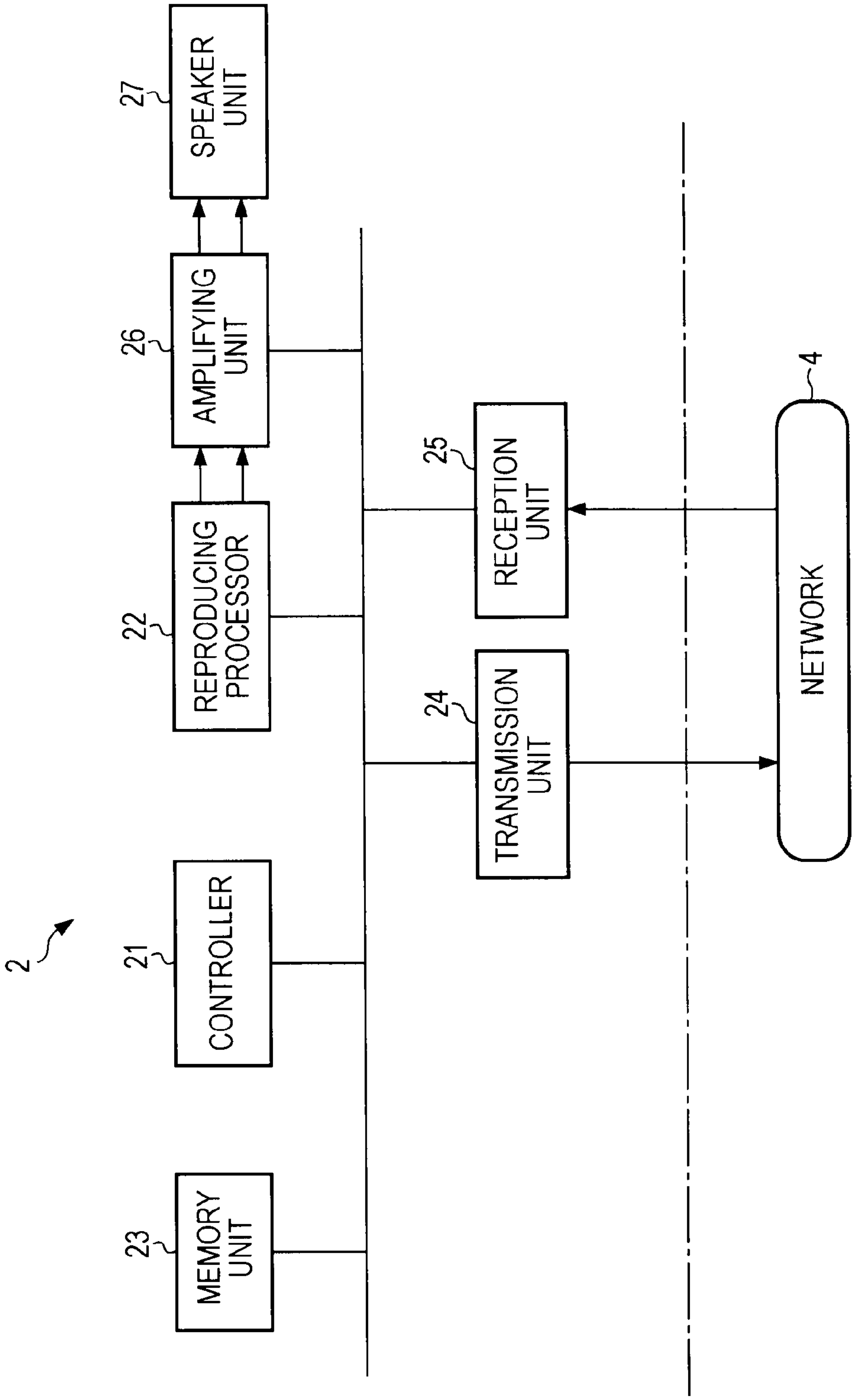
FIG. 4 is a block diagram illustrating a network speaker according to the embodiment.

Although the configuration as the network speaker 2 is shown in FIG. 4, it is necessarily the case that the network speaker 2B, 2C, and 2D have the same configuration described above, that is, other portions may be added and some portions of the configuration shown in FIG. 4 may be omitted.

3-3: Remote Controller

Next, an example of a configuration of the remote controller 3 will be described with reference to FIG. 5.

The remote controller 3 includes a controller 41, a command memory 42, a transmission/reception unit 43, a display driving unit 44, a display unit 45, a touch panel sensor 46, and a position detector 47.

The controller 41 includes a microcomputer.

The command memory 42 includes a ROM, a nonvolatile memory, or the like and stores various command codes.

The transmission/reception unit 43 performs modulation and transmission in accordance with a predetermined communication method used to transmit a command code. The transmission/reception unit 43 further performs communication with the other apparatuses on the network 4 and reception of information from the apparatuses.

Using the remote controller 3, a user's operation is performed by operating a touch panel. Therefore, the display unit 45 is provided and the touch panel sensor 46 is disposed on a display screen of the display unit 45.

The display unit 45 corresponds to a liquid crystal panel or an organic EL panel, for example, and the touch panel is constituted such that the touch panel sensor 46 including a piezoelectric sensor or an electrostatic sensor is disposed on a surface of the display unit 45.

In the display unit 45, operation buttons and icons are displayed, for example, so that various operation inputs may be performed. In this embodiment, as display for the operation inputs, volume operation display 70 is performed on the display unit 45 which will be described with reference to FIG. 6 onwards as display of operation inputs, and the user may perform an operation input by touching the volume operation display 70.

That is, an operation unit is provided for the user by a function of so-called GUIs (Graphical User Interfaces).

The display unit 45 is driven by the display driving unit 44 for display. When the controller 41 supplies display data to the display driving unit 44, the display driving unit 44 supplies a display driving signal to the display unit 45 in accordance with the display data and the display unit 45 performs certain screen display. For example, volume operation display shown in FIG. 6, display of other various operation keys and icons, and operation menu display are executed.

The user performs a touch operation in accordance with display content. The touch panel sensor 46 transmits information on the touch operation to the position detector 47. The position detector 47 detects a position of the user's operation (touch operation) (a position of an X-Y coordinate on the display screen) and transmits the position to the controller 41 as touch position information.

The controller 41 includes, as a functional configuration realized by software programs, a command reading unit 41*a*, a display controller 41*b*, an input detector 41*c*, and a transmission/reception controller 41*e*.

The input detector 41*c* recognizes the information on the touch position supplied from the position detector 47 and determines operation content desired by the user in accordance with the touch position or trajectory of the touch operation.

The command reading unit 41*a* reads a command code from the command memory 42 in accordance with operation content determined by the input detector 41*c* and supplies the command code to the transmission/reception controller 41*e*.

The transmission/reception controller 41*e* performs control of transmission of the command code read by the command reading unit 41*a* to the transmission/reception unit 43. In this case, the transmission/reception unit 43 modulates the command code and transmits the command code to an apparatus to be controlled on the network 4 in a predetermined communication method.

Furthermore, the transmission/reception controller 41*e* receives information, e.g., information on volumes currently set to the apparatuses, transmitted from the other apparatus on the network 4 through the transmission/reception unit 43. The volume setting information of the apparatuses is reflected to the display content in the volume operation display which will be described hereinafter.

The display controller 41*b* supplies display data corresponding to content to be displayed in the display unit 45 to the display driving unit 44. For example, display data used to execute display of operation icons, display of operation menu, the volume operation display, and the like in the display unit 45 is generated.

Furthermore, the display controller 41*b* controls change of the display content on the display screen in accordance with the touch operation detected by the input detector 41*c*.

When the user performs a touch operation, the remote controller 3 reads a command code from the command memory 42 in accordance with the touch operation performed by the user and transmits the command code as a control command to the appropriate apparatus on the network 4.

4. Operation Using Volume Operation Display

In this embodiment, volume control of the plurality of audio output apparatuses (the reproducing apparatus 1 and the network speaker 2B, 2C, and 2D) on the network 4 may be performed using the remote controller 3.

Figure 6:
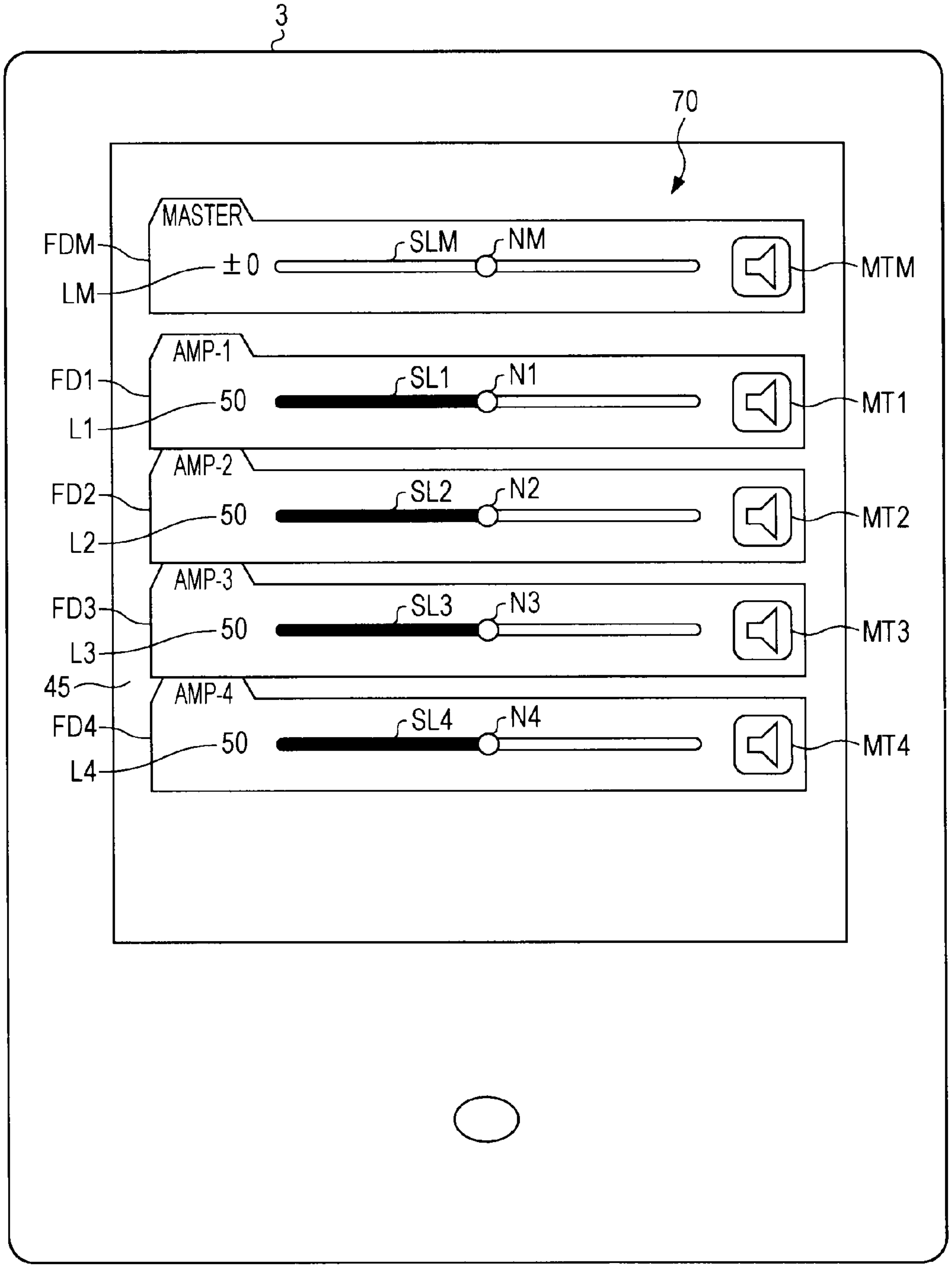
FIG. 6 is an explanatory diagram illustrating the remote controller.

Therefore, in the display unit 45 of the remote controller 3, GUI display is performed as represented by the volume operation display 70 shown in FIG. 6, for example.

The volume operation display 70 includes display of a master volume setting section FDM and individual volume setting sections FD1 to FD4.

The individual volume setting sections FD1 to FD4 correspond to the audio output apparatuses to be controlled. Specifically, in this example, the individual volume setting section FD1 is displayed so as to correspond to the reproducing apparatus 1.

Furthermore, the individual volume setting sections FD2, FD3, and FD4 are displayed so as to correspond to the network speakers 2B, 2C, and 2D, respectively.

On the other hand, the single master volume setting section FDM is displayed to collectively control the volumes of the plurality of audio output apparatuses.

The master volume setting section FDM includes a slide bar SLM and a setting position on the slide bar SLM is representing by a master knob NM. The master knob NM is moved leftward and rightward on the slide bar SLM by the touch operation performed by the user. That is, the master knob NM serves as a slide operation member of the master volume setting section FDM.

Furthermore, the master volume setting section FDM includes a numerical-value display section LM. The numerical-value display section LM displays a numerical value corresponding to a slide position of the master knob NM, that is, a numerical value corresponding to an amount of changing of a volume setting performed by the master volume setting section FDM. For example, as shown in the drawing, when the master knob NM is located at the center of the slide bar SLM, "±0" is displayed in the numerical-value display section LM.

An operation of moving the master knob NM leftward corresponds to an operation of lowering setting volumes of the audio output apparatuses. When the master knob NM is slid leftward, "−1" to "−50" are displayed in the numerical-value display section LM. Furthermore, when the setting volumes are turned up by sliding the master knob NM rightward, "+1" to "+50" are displayed in the numerical-value display section LM.

Note that this is an example of a case where the volume setting may be performed in a range from "−100" to "+100" in an entire length of the slide bar SLM.

Furthermore, the master volume setting section FDM includes a mute button MTM. The user may instruct stop (mute) of audio output by operating the mute button MTM while the setting volumes of the audio output apparatuses are not changed.

On the other hand, the individual volume setting sections (FD1 to FD4) includes slide bars (SL1 to SL4), knobs (N1 to N4), numerical-value display sections (L1 to L4), and mute buttons (MT1 to MT4), respectively.

For example, as for the individual volume setting section FD1, when the user moves the knob N1 leftward or rightward on the slide bar SL1, a setting value of an output volume of the reproducing apparatus 1 serving as the audio output apparatus corresponding to the individual volume setting section FD1 is increased or reduced. An operation of moving the knob N1 leftward corresponds to an operation of turning down the setting volume of the reproducing apparatus 1 whereas an operation of moving the knob N1 rightward corresponds to an operation of turning up the setting volume of the reproducing apparatus 1.

In the slide bar SL1, a portion on the left side relative to the knob N1 has a distinctive color so that a current volume setting may be distinctively viewed as a bar graph.

Furthermore, an entire length of the slide bar SL1 corresponds to a range of the volume setting from "0" to "100", and a value of a current setting volume is displayed in the numerical-value display section L1. In the case of FIG. 6, since the knob N1 is located at the center of the slide bar SL1, "50" is displayed in the numerical-value display section L1.

Furthermore, the mute button MT1 is used to perform a mute operation of the corresponding audio output apparatus. Specifically, the user instructs the reproducing apparatus 1 to stop (mute) audio output while the setting volume is not changed by operating the mute button MT1.

By using the individual volume setting section FD1 as described above, the user may perform an operation of varying the setting of the output volume on the reproducing apparatus 1 and recognize a current volume setting state by a numerical value and the slide bar (a position of the knob) at first sight. Moreover, the reproducing apparatus 1 may be temporarily muted by performing the mute operation.

In addition, using of the individual volume setting sections FD2 to FD4, the user may perform arbitrary volume setting operations and arbitrary mute operations on the network speakers 2B, 2C, and 2D and may recognize current volume setting states.

Figure 7A:
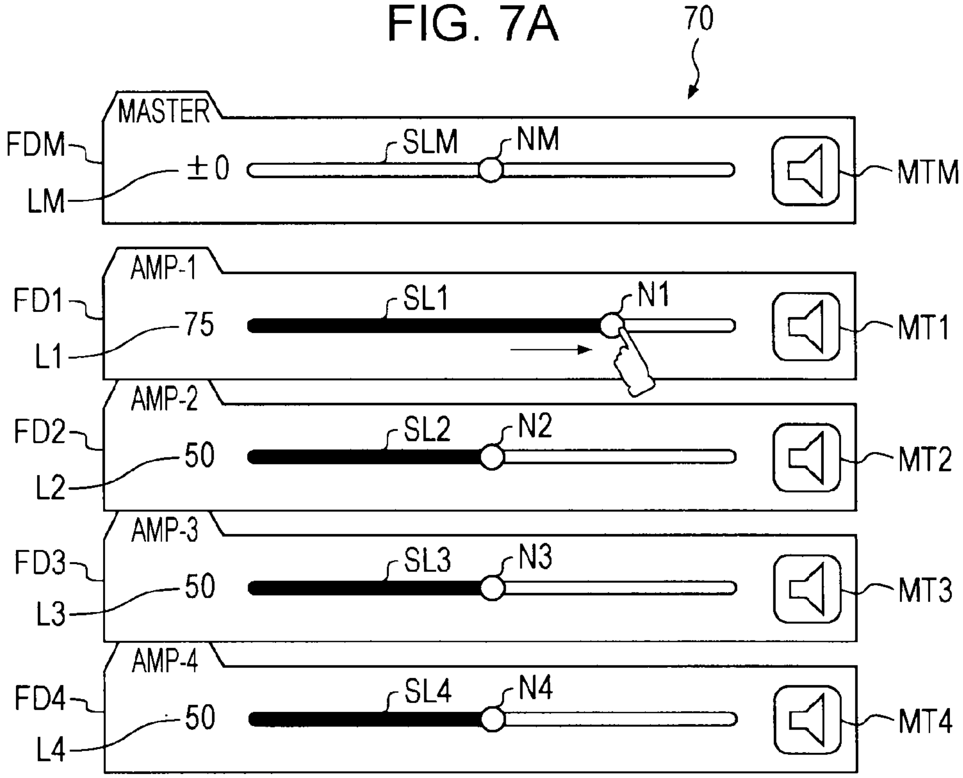
FIGS. 7A and 7B are explanatory diagrams illustrating volume operation display according to the embodiment.

Operations of the audio output apparatuses will be described with reference to FIG. 7A.

For example, when the user desires to turn up the volume set in the reproducing apparatus 1, the user moves the knob N1 rightward on the slide bar SL1 while touching the knob N1.

Figure 5:
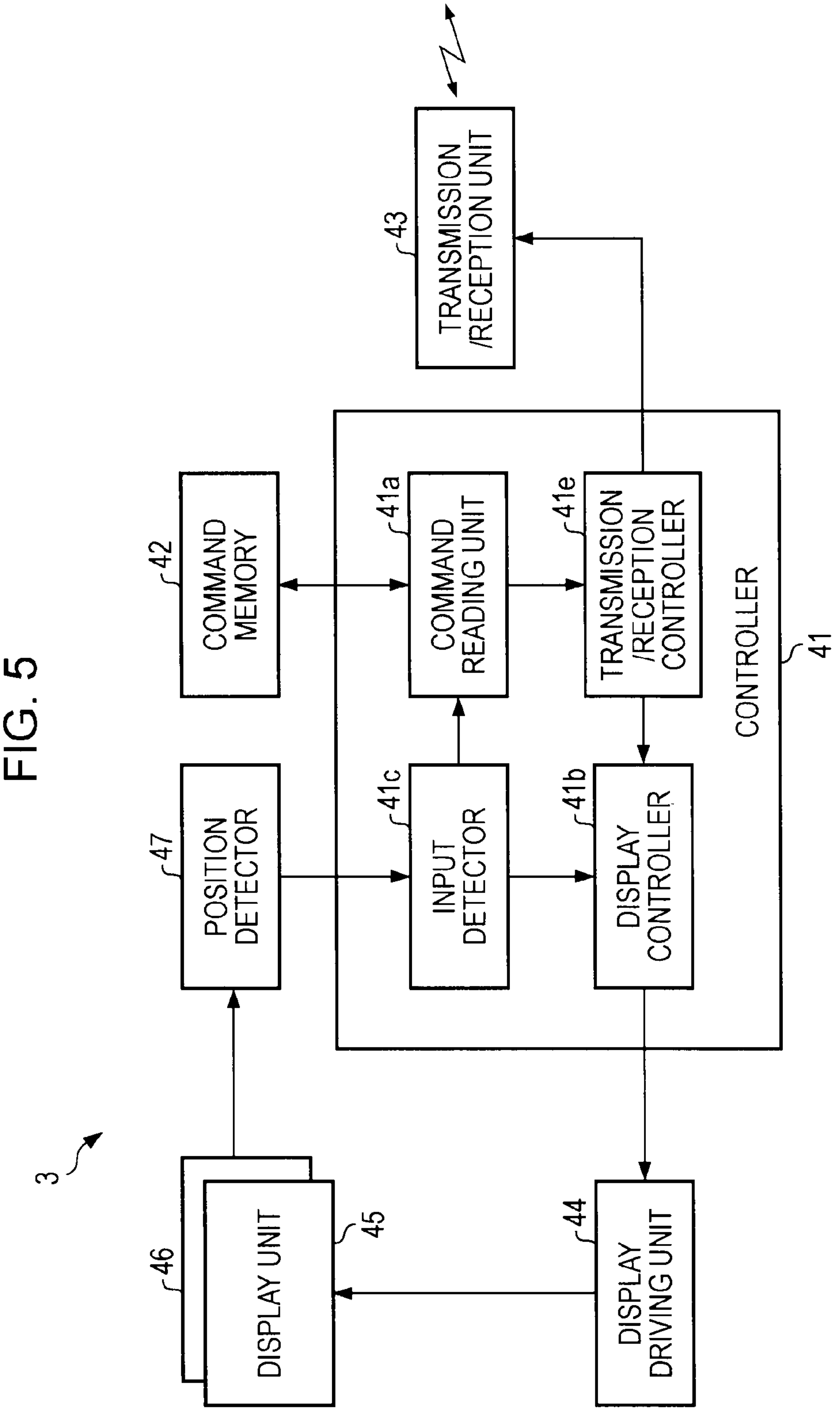
FIG. 5 is a block diagram illustrating a remote controller according to the embodiment.

When detecting such a user's operation, the controller 41 shown in FIG. 5 causes the knob N1 to be moved in the display so as to follow a finger of the user and changes a numerical value of the numerical-value display section L1. Furthermore, in accordance with the operation, the controller 41 transmits a control command used to turn up an output volume set in the reproducing apparatus 1 by an amount of the operation. For example, as shown in the drawing, when the user moves the knob N1 to a position corresponding to "75", the controller 41 transmits a control command which upgrades a level of volume setting state to a level corresponding to "75" to the reproducing apparatus 1. The controller 11 of the reproducing apparatus 1 controls a main volume setting in the amplifying unit 17 in a variable manner in accordance with reception of the control command. Accordingly, the output volume of the reproducing apparatus 1 in the room A is turned up to the level corresponding to "75".

The user may individually control the output volume settings of the reproducing apparatus 1 and the network speakers 2B, 2C, and 2D using the individual volume setting sections FD1 to FD4. For example, when the volume set in the network speaker 2C in the room C is to be turned down, the knob N3 of the individual volume setting section FD3 is slid leftward. By this, the remote controller 3 transmits a control command used to turn down the setting volume to the network speaker 2C, and the controller 21 of the network speaker 2C performs control of turning down of the setting volume using the amplifying unit 26 in accordance with the control command.

Specifically, the user may control the volumes of music or the like in the individual rooms A to D in accordance with environments, installation states, performances of the apparatuses, purposes of use of the rooms, and the like.

Figure 7B:
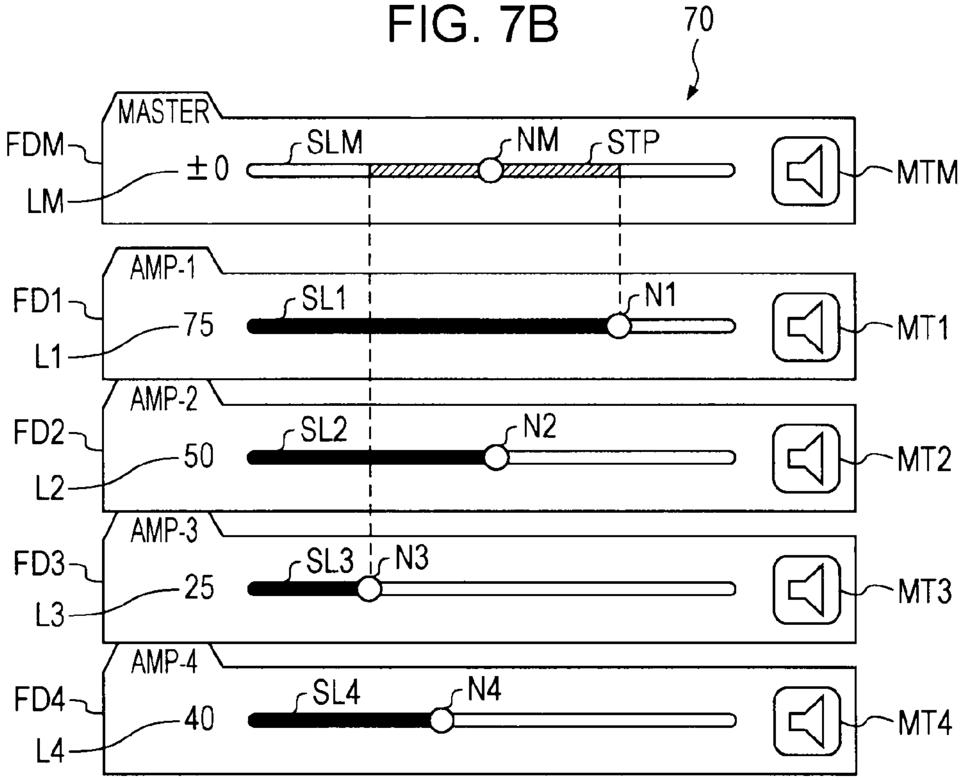

For example, FIG. 7B shows a state in which the user performs the volume settings in the individual rooms using the individual volume setting sections FD1 to FD4.

In this case, the reproducing apparatus 1 in the room A is controlled to be the level "75", the network speaker 2B in the room B is controlled to be a level "50", the network speaker 2C in the room C is controlled to be a level "25", and the network speaker 2D in the room D is controlled to be a level "40".

On the other hand, the user may collectively turns up or down the volumes set in the audio output apparatuses in the individual rooms using the master volume setting section FDM. In addition, the operation is collectively performed while the relative balance among the volumes set in the audio output apparatuses is maintained as shown in FIG. 7B.

Figure 9A:
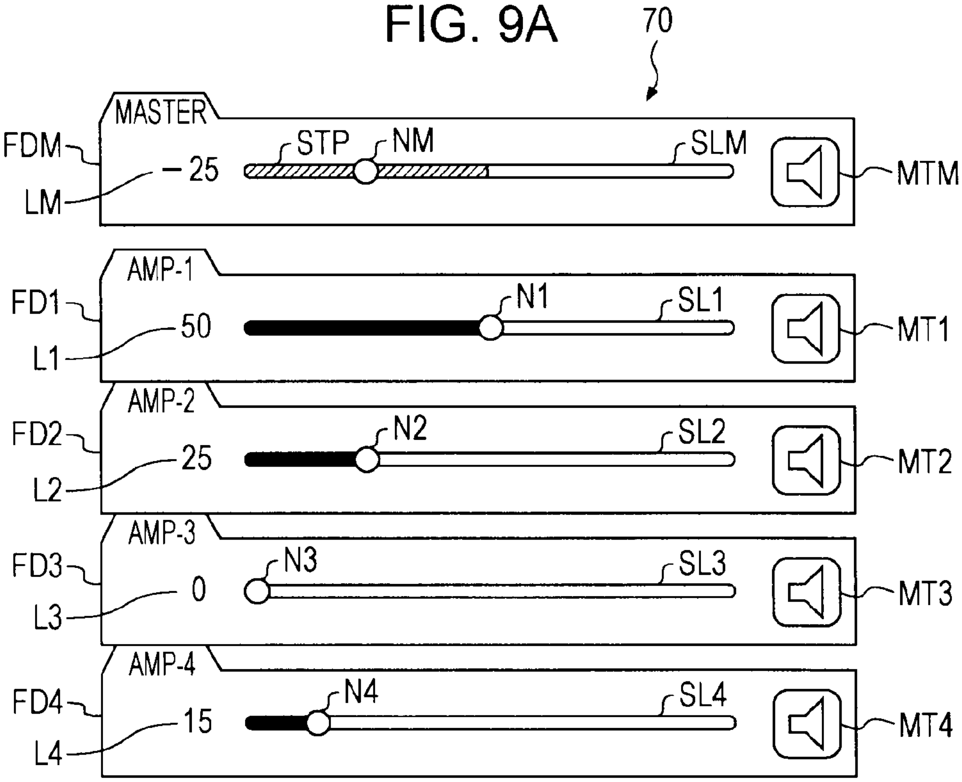
FIGS. 9A and 9B are explanatory diagrams illustrating display states corresponding to operations of the master volume setting section within the setting changeable range according to the embodiment.

For example, FIG. 9A shows a case where the user slides the master knob NM leftward to a level of "−25" from the state shown in FIG. 7B.

The controller 41 of the remote controller 3 causes the master knob NM to follow the finger in the display in accordance with a detection of the user's operation performed on the master knob NM, and changes the numerical value of the numerical-value display section LM. Furthermore, as for the individual volume setting sections FD1 to FD4, positions of the knobs N1 to N4 are moved by a distance corresponding to "−25" simultaneously when the master knob NM is operated (or immediately after the master knob NM is operated) by the user and numerical values of the numerical-value display sections L1 to L4 are reduced by 25.

Then, along with such a display control, the controller 41 transmits a control command used to turn down the set output volumes by an amount of the operation, that is, by "25" to the reproducing apparatus 1 and the network speaker 2B, 2C, and 2D.

By receiving the control command, the reproducing apparatus 1 and the network speaker 2B, 2C, and 2D individually change the main volume settings. By this, the output volumes in the rooms A to D are simultaneously reduced by a level corresponding to "−25".

Figure 9B:
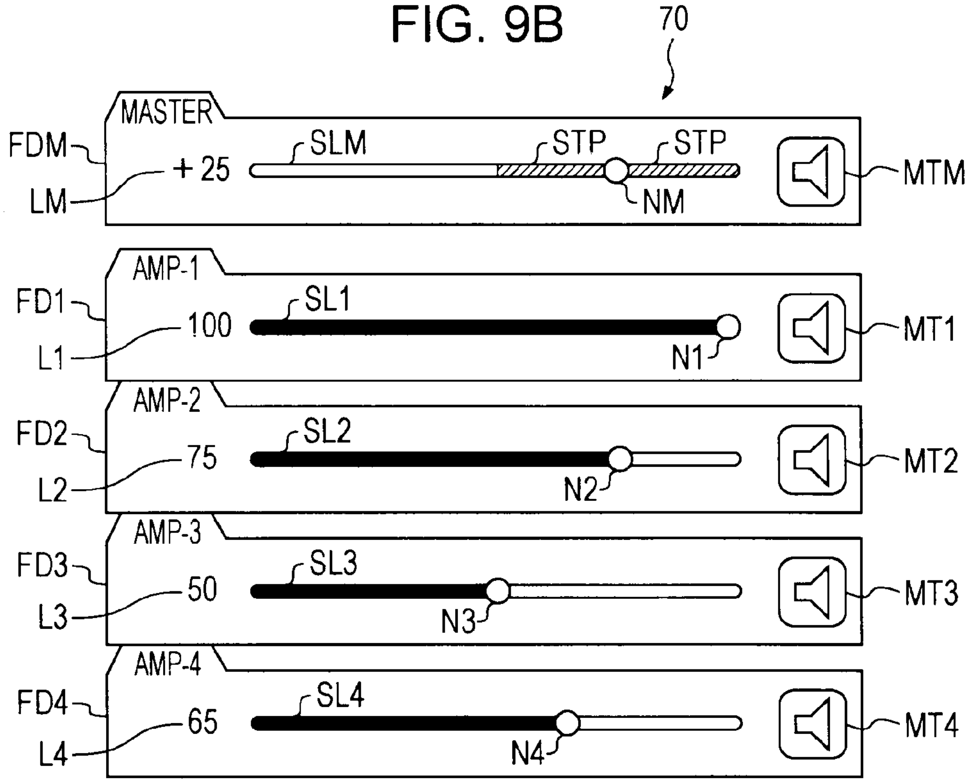

For example, FIG. 9B shows a case where the user slides the master knob NM rightward to a level of "+25" from the state shown in FIG. 7B.

The controller 41 of the remote controller 3 causes the master knob NM to follow the finger in the display in accordance with a detection of the user's operation performed on the master knob NM, and changes the numerical value of the numerical-value display section LM. Furthermore, as for the individual volume setting sections FD1 to FD4, positions of the knobs N1 to N4 are moved by a distance corresponding to "+25" simultaneously when the master knob NM is operated (or immediately after the master knob NM is operated) by the user and the numerical values of the numerical-value display sections L1 to L4 are increased by 25.

Then, along with such display control, the controller 41 transmits a control command used to turn up the set output volumes by an amount of the operation, that is, by "25" to the reproducing apparatus 1 and the network speaker 2B, 2C, and 2D.

By receiving the control command, the reproducing apparatus 1 and the network speaker 2B, 2C, and 2D individually change the main volume settings. By this, the output volumes in the rooms A to D are simultaneously turned up by a level corresponding to "+25".

In the cases shown in FIGS. 9A and 9B, the relative balance among the audio output apparatuses, i.e., the reproducing apparatus 1 and the network speaker 2B, 2C, and 2D has been maintained.

Here, as shown in the master volume setting section FDM of FIG. 7B, in order to perform the collective operation while the volume balance is maintained, a stopper STP is displayed on the slide bar SLM so that a setting changeable range is clearly displayed.

The stopper STP is displayed as if a stick is extended from the master knob NM rightward and leftward within the slide bar SLM and represents for the user that the master knob NM may be only slid within a range in which the stopper STP abuts opposite ends of the slide bar SLM.

Figure 8A:
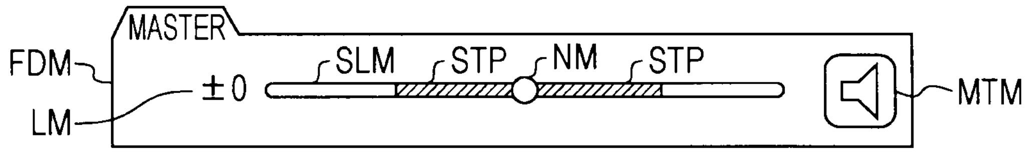
FIGS. 8A to 8C are explanatory diagrams illustrating an operation of a master volume setting section including a setting changeable range according to the embodiment.
Figure 8B:
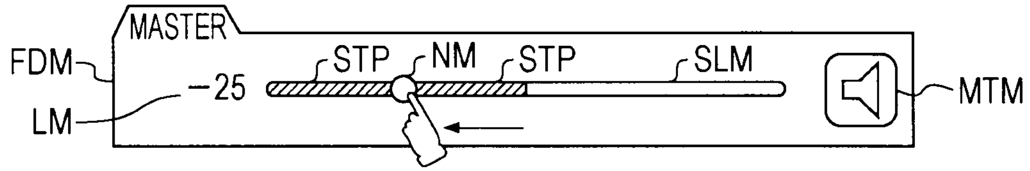

A description thereof will be made with reference to FIGS. 8A to 8C. FIG. 8A shows a state in which the master knob NM is located in a position corresponding to the level of "±0". A state shown in FIG. 8B is obtained by sliding the master knob NM leftward in this state. This slide operation may only carried out until the stopper STP contacts the left end of the slide bar SLM.

Figure 8C:
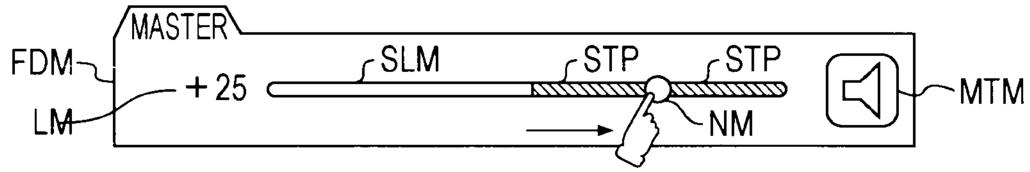

Furthermore, a state shown in FIG. 8C is obtained by sliding the master knob NM rightward. This slide operation may only carried out until the stopper STP contacts the right end of the slide bar SLM.

Specifically, the stopper STP represents that the master knob NM may only slid within a range from the state shown in FIG. 8B to the state shown in FIG. 8C.

That means restriction of a slide range of the master knob NM within the range in which collective change of the volume settings is allowed while the balance among the volumes of the audio output apparatuses is maintained.

Therefore, the range of display of the stopper STP is determined in accordance with the volume setting values in the individual volume setting sections FD1 to FD4 as shown in FIG. 7B. That is, the right end of the stopper STP corresponds to the largest volume setting value (the setting value of the individual volume setting section FD1 in this case) whereas the left end of the stopper STP corresponds to the smallest volume setting value (the setting value of the individual volume setting section FD3 in this case).

In the state shown in FIG. 8B, the left end of the stopper STP contacts the left end of the slide bar SLM. This is a state in which a collective volume setting is set to "−25" using the master knob NM, for example.

That is, an entire state of the volume operation display 70 is shown in FIG. 9A. Here, the volume set in the individual volume setting section FD3 (network speaker 2C) which is the smallest volume setting is reduced to a level of "0".

Then, even if the master knob NM is moved further leftward and a control command corresponding to the movement is transmitted to the audio output apparatuses, the output volume of the network speaker 2C is not turned down since the output volume of the network speaker 2C has been set to zero, but the volumes set in the reproducing apparatus 1 and the network speakers 2B and 2D are turned down. In this case, the balance among the volumes of the audio output apparatuses is deteriorated.

In the state shown in FIG. 8C, the right end of the stopper STP contacts the right end of the slide bar SLM. This is a state in which a collective volume setting is set to a level of "+25" using the master knob NM, for example.

That is, the entire state of the volume operation display 70 is shown in FIG. 9B. Here, the volume set in the individual volume setting section FD1 (network speaker 2C) which is the largest volume setting is increased to a level of "100" (the maximum level).

Then, even if the master knob NM is moved further rightward and a control command corresponding to the movement is transmitted to the audio output apparatuses, the output volume of the reproducing apparatus 1 is not further turned up, but the volumes set in the network speakers 2B, 2C, and 2D are turned up. In this case also, the balance among the volumes of the audio output apparatuses is deteriorated.

In other words, when the slide operation is performed within the range restricted by the stopper STP, collective control may be performed while the volume balance is maintained. Accordingly, the slidable range of the master knob NM is restricted by the stopper STP.

As described above, the stopper STP clearly represents for the user that the master knob NM may be operated within the certain range in which the volume balance is maintained and restricts the slide range of the master knob NM. The user recognizes the slide range according to the display of the stopper STP and may easily execute an operation of collective control while the volume balance is maintained.

Note that the master knob NM may be slid beyond the restriction defined by the stopper STP. This case will be described hereinafter.

Although the display of the stopper STP has been taken as an example of display clearly representing the setting changeable range, other examples of display of the setting changeable range may be considered.

Figure 10:
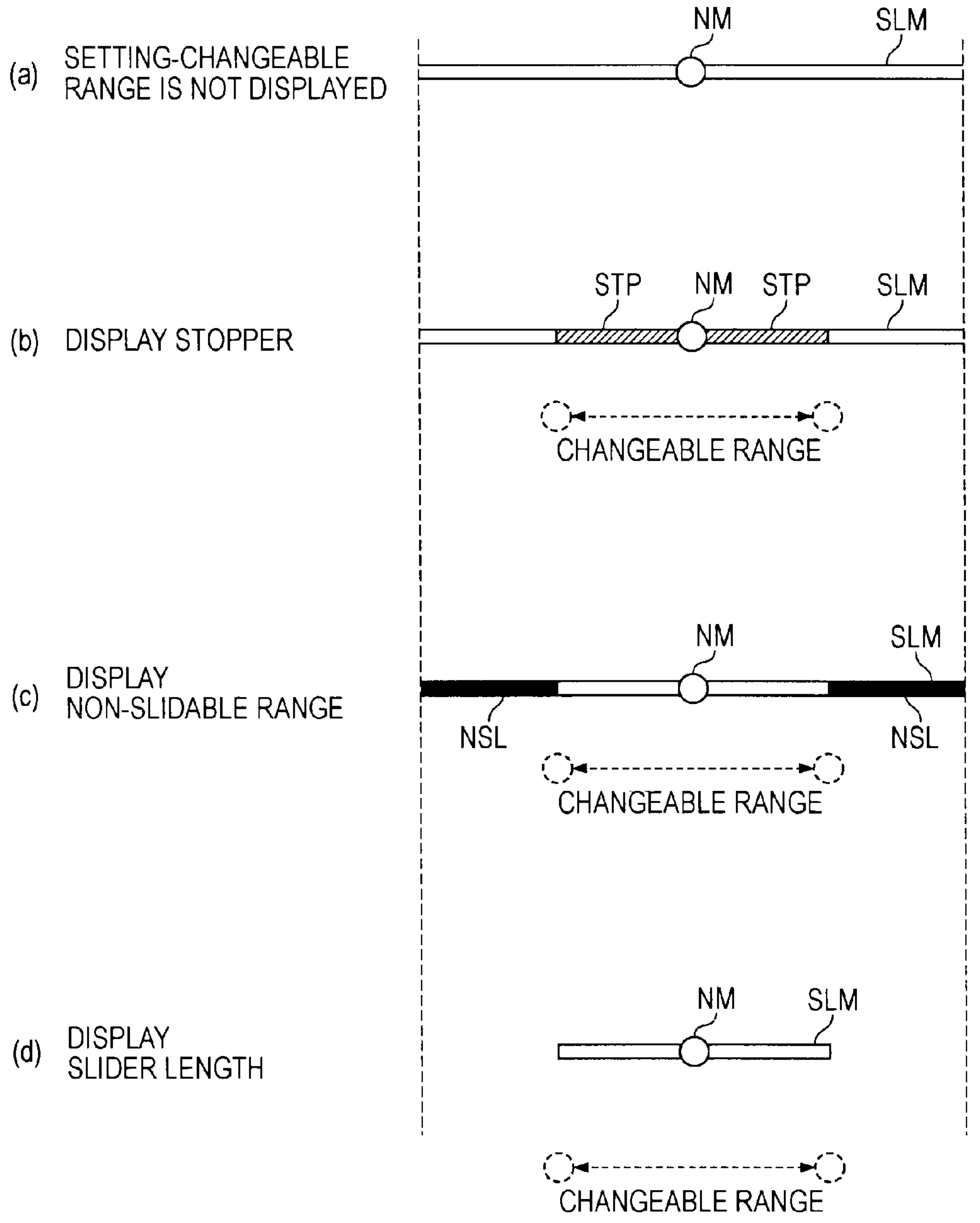
FIG. 10 is an explanatory diagram illustrating display of the setting changeable range according to the embodiment.

FIG. 10(*a*) shows a state in which the setting changeable range is not displayed and the master knob NM is movable from the left end to the right end of the slide bar SLM. For example, in the case where all the individual volume setting sections FD1 to FD4 correspond to a level "50" as shown in FIG. 6, the volume balance is not deteriorated wherever the master knob NM is moved in the range from the left end to the right end of the slide bar SLM, and therefore, the restriction is not made.

FIG. 10(*b*) shows an example in which the setting changeable range is displayed using the stopper STP as described above.

FIG. 10(*c*) shows an example in which a movable range of the master knob NM is restricted using the slide bar SLM by changing a color of portions of the slide bar SLM, for example. Black portions in the drawing correspond to ranges in which the master knob NM is not allowed to be moved.

FIG. 10(*d*) shows an example in which the length of the slide bar SLM is changed. The slidable range of the master knob NM may be shown in this way.

Figure 11:
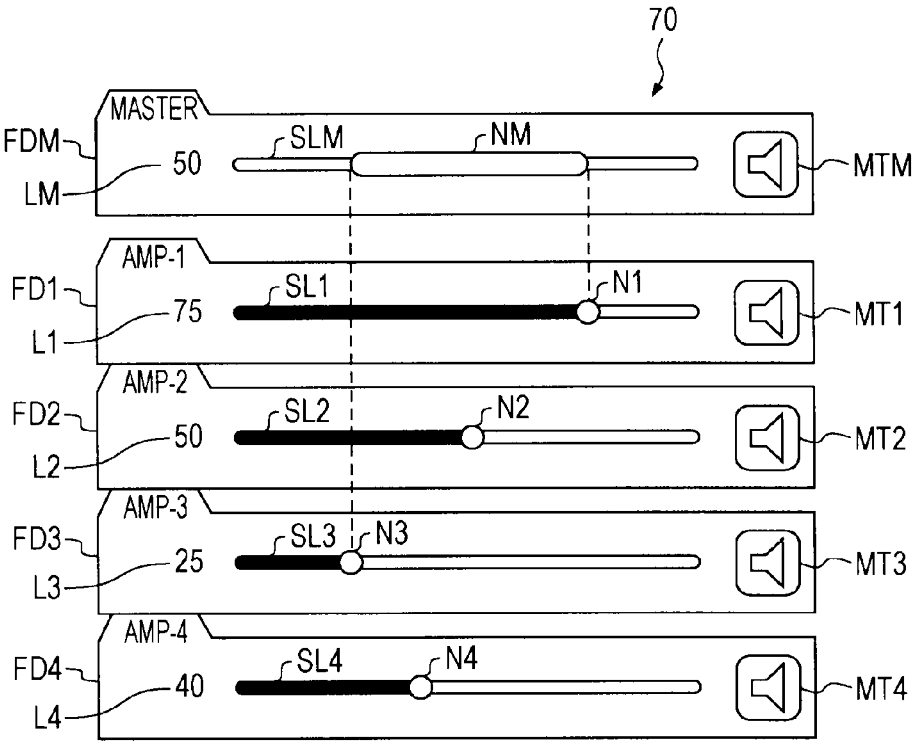
FIG. 11 is an explanatory diagram illustrating another display of the setting changeable range according to the embodiment.

Furthermore, FIG. 11 shows another example of a display clearly representing the setting changeable range.

In the example shown in FIG. 11, as the display clearly representing the setting changeable range, the master knob NM having a size corresponding to the setting changeable range is displayed.

That is, the master knob NM has an oval shape and a size thereof is changed in accordance with the setting changeable range. In this case, the master knob NM having the oval shape includes a left end located in a position corresponding to one of the knobs of the individual volume setting sections in which the smallest volume has been currently set (in this example, the knob N3 of the individual volume setting section FD3) and a right end located in a position corresponding to one of the knobs of the individual volume setting sections in which the largest volume has been currently set (in this example, the knob N1 of the individual volume setting section FD1).

In this case, when the master knob NM is moved to the leftmost position, the volume setting of the individual volume setting section FD3 represents "0" whereas when the master knob NM is moved to the rightmost position, the volume setting of the individual volume setting section FD1 represents "100".

In this way, the setting changeable range may be displayed for the user in a display state in which the size of the master knob NM serving as an operation member is changed in accordance with the setting changeable range.

As described above, the display of the setting changeable range in the collective control while the volume balance is maintained may be performed in various methods.

Hereinafter, as the display of the setting changeable range, an example using the stopper STP will be described.

As shown in FIG. 7B, the setting changeable range is determined in accordance with the volume settings of the individual volume setting sections FD1 to FD4 (audio output apparatuses). Therefore, a length of the stopper STP and display of a position of the master knob NM in the master volume setting section FDM are changed in accordance with the variable operation of the volume setting of one of the individual volume setting sections FD1 to FD4.

Figure 12A:
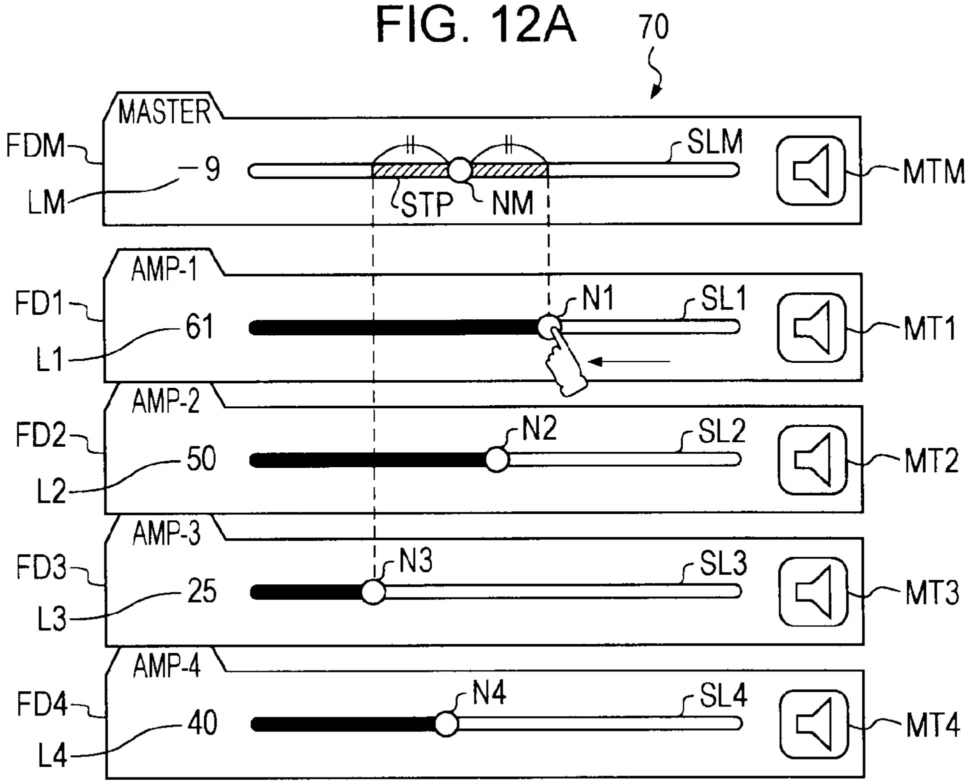
FIGS. 12A and 12B are explanatory diagrams illustrating display of a knob at the center within the setting changeable range according to the embodiment.

It is assumed that, in the state shown in FIG. 7B, the user operates the knob N1 of the individual volume setting section FD1 as shown in FIG. 12A. For example, the level of the volume setting of the reproducing apparatus 1 corresponding to the individual volume setting section FD1 is lowered from "75" to "61".

In the state shown in FIG. 12A, as with the case of FIG. 7B, the largest volume setting value corresponds to the setting value of the individual volume setting section FD1, but the volume setting value is reduced to the level of "61". In accordance with this, the right end of the stopper STP is changed to a position corresponding to a position of the knob N1 of the individual volume setting section FD1. The right end of the stopper STP stays in a position corresponding to the knob N3 of the individual volume setting section FD3.

Meanwhile, the master knob NM is positioned at the center of a range represented by the stopper STP. Therefore, in this case, the master knob NM is displayed in a position corresponding to "−9". That is, the master knob NM is located in a position in which lengths of right and left extending portions of the stopper STP are equal to each other.

Note that, in this drawing, although the numerical-value display section LM represents "−9" in accordance with the change of the position of the master knob NM, since the master knob NM is not actually operated in this case, the numerical-value display section LM may not be changed from "±0" even when the position of the master knob NM corresponds to "−9". That is, a numerical value of the numerical-value display section LM may correspond to the position of the master knob NM in the display or may correspond to the value obtained in accordance with an amount of the operation of the master knob NM.

Figure 12B:
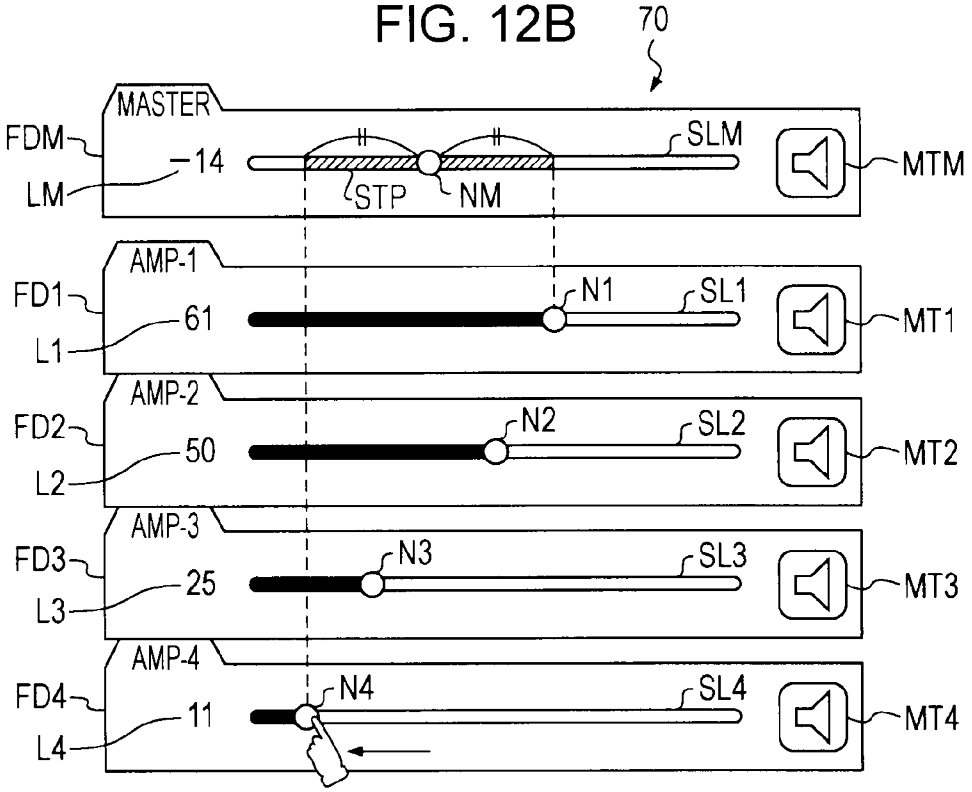

Furthermore, FIG. 12B shows a state in which the user lowers the level of the knob N4 of the individual volume setting section FD4 to "11" from the state shown in FIG. 12A.

In this case, the largest volume setting value corresponds to "61" of the individual volume setting section FD1 whereas the smallest volume setting value corresponds to "11" of the individual volume setting section FD4, and the stopper STP corresponding to the largest volume setting value and the smallest volume setting value is displayed. Then, the master knob NM is displayed at the center of the stopper STP. Therefore, the master knob NM is displayed in a position corresponding to "−14". In this case also, the numerical-value display section LM may not be changed from "±0".

The setting changeable range of the master knob NM is changed in accordance with changes of the volume settings of the audio output apparatuses while the volume balance is maintained. Therefore, in accordance with the operations of the individual volume setting sections FD1 to FD4 described above, the range of the stopper STP and the display position of the master knob NM are also changed. In this way, the user may normally clearly recognize the slide range which maintains the balance when an operation using the master knob NM is performed in a visual manner.

5. Knob Lock Operation

Here, although the user may operate the collective volume setting and the individual volume settings by touching the master knob NM and the knobs N1 to N4 and sliding the master knob NM and the knobs N1 to N4, it is likely that the user unwillingly touches by a finger the display unit 45 serving as the touch panel screen, and accordingly, an unexpected volume variable setting may be performed. It is inconvenient if the unexpected volume variable setting is performed after the user performed a volume setting operation taking the appropriate balance into consideration.

Accordingly, the master knob NM and the knobs N1 to N4 may be subjected to a lock process (a process of banning an operation) so as not to be operated when being carelessly touched.

Figure 13A:
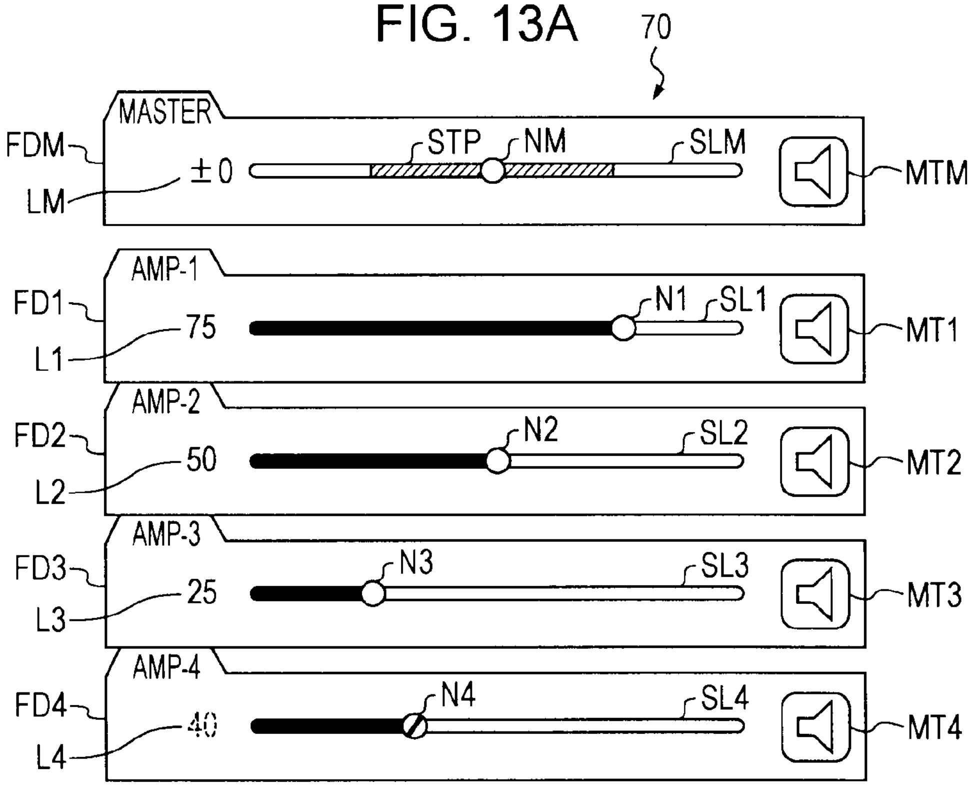
FIGS. 13A and 13B are explanatory diagrams illustrating a knob lock operation according to the embodiment.

For example, FIG. 13A shows a state in which the knob N4 is locked after the volume settings of the audio output apparatuses are performed as shown in FIG. 7B.

It is assumed that when the user taps (by a finger) an arbitrary knob, for example, the knob is locked. When the user tapped the knob N4, the controller 41 brings the knob N4 to a locked state. In display, as shown in FIG. 13A, the knob N4 is displayed in a locked state. Furthermore, as shown in the drawing, the numerical value of the numerical-value display section L4 may be displayed by a faint color (as an inactive display, for example). Alternatively, the entire individual volume setting section FD4 may be displayed in an inactive state.

After bringing the knob N4 to the locked state, even when an operation of sliding the knob N4 is detected, the controller 41 disables the operation, and therefore, a process of changing the volume settings and a process of changing display are not performed.

This is true for the other knobs N1 to N3 and the master knob NM. For example, when the user tapped the master knob NM, the controller 41 brings the master knob NM to a locked state and display is changed so that the fact that the master knob NM has been locked is represented.

When the locked state of the knob is to be cancelled, the user taps again the locked knob. For example, when the lock of the knob N4 is to be cancelled from the state shown in FIG. 13A, the knob N4 is tapped. Then, the controller 41 changes the display back to the state shown in FIG. 7B and operation inputs performed afterward on the knob N4 are accepted as valid operation inputs.

Furthermore, when the knobs N1 to N4 of the individual volume setting sections FD1 to FD4 are all locked, for example, the master knob NM may be automatically brought to a locked state. This is because, when all the knobs N1 to N4 are locked, that is, when the volume settings of all the audio output apparatuses are fixed, the collective operation is not allowed to be performed using the master knob NM, and accordingly, the fact that an operation of the master knob NM is invalid is preferably displayed for the user.

Here, when the master knob NM is operated while some knobs are locked and the others are not locked in the individual volume setting sections FD1 to FD4, the operation of the master knob NM is reflected to the knobs which have not been locked.

Figure 13B:
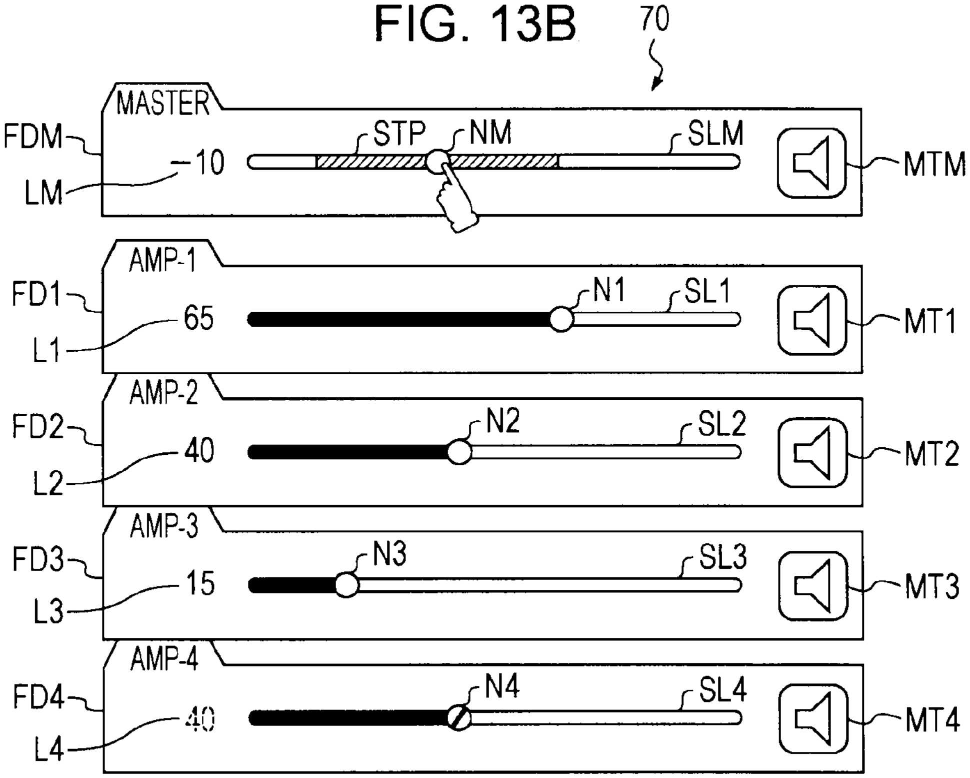

It is assumed that, in a state in which the knob N4 is locked and the knobs N1 to N3 are not locked as shown in FIG. 13A, the master knob NM is moved to a position corresponding to "−10" as shown in FIG. 13B.

In this case, the individual volume setting section FD4 is not simultaneously moved with the master knob NM and the position of the knob N4 is fixed. Then, the individual volume setting sections FD1 to FD3 are simultaneously moved with the master knob NM and the positions of the knobs N1 to N3 are moved leftward by a degree corresponding to "−10". Furthermore, a control command used to turn down the volumes of the reproducing apparatus 1 and the network speakers 2B and 2C by the degree corresponding to "−10" is transmitted to the reproducing apparatus 1 and the network speakers 2B and 2C.

By this, even when some of the individual volume setting sections are locked but the others are not locked, the individual volume setting sections which are not locked are simultaneously controlled in accordance with the operation of the master volume setting section FDM. Accordingly, the master volume setting section FDM is efficiently utilized which is preferable.

Furthermore, in this case, the collective control is performed using the master knob NM on the knobs except for the locked knobs (the audio output apparatuses in which the volume settings are locked), and this operation means a volume setting variable operation performed on the audio output apparatuses except for the locked audio output apparatuses while the volume balance is maintained. Therefore, when a certain knob is locked, display of the stopper STP of the master knob NM (and a position of the master knob NM) may be changed within a range from the largest setting value to the smallest setting value obtained after the certain knob is excepted.

When the knob N1 is locked in the state shown in FIG. 7B, for example, and therefore, the knob N1 is excepted, the largest setting value corresponds to a level of "50" of the knob N2. Accordingly, a range from a level of "25" of the knob N3 serving as the smallest setting value to the level of "50" serving as the largest setting value is represented by the stopper STP.

It is apparent that, also when the certain knob is unlocked and when the range from the largest setting value to the smallest setting value is changed due to unlocking of the locked knob, display of the stopper STP and display of the position of the master knob NM are also changed.

6. Mute Operation

In this embodiment, an operation of temporarily entering a mute state (volume zero) is enabled using the remote controller 3 without changing the volume setting values of the audio output apparatuses.

As described above, the master volume setting section FDM and the individual volume setting sections FD1 to FD4 include the mute button MTM and the mute buttons MT1 to MT4, respectively. The user may instruct a mute operation by tapping an arbitrary one of the mute buttons.

Figure 14A:
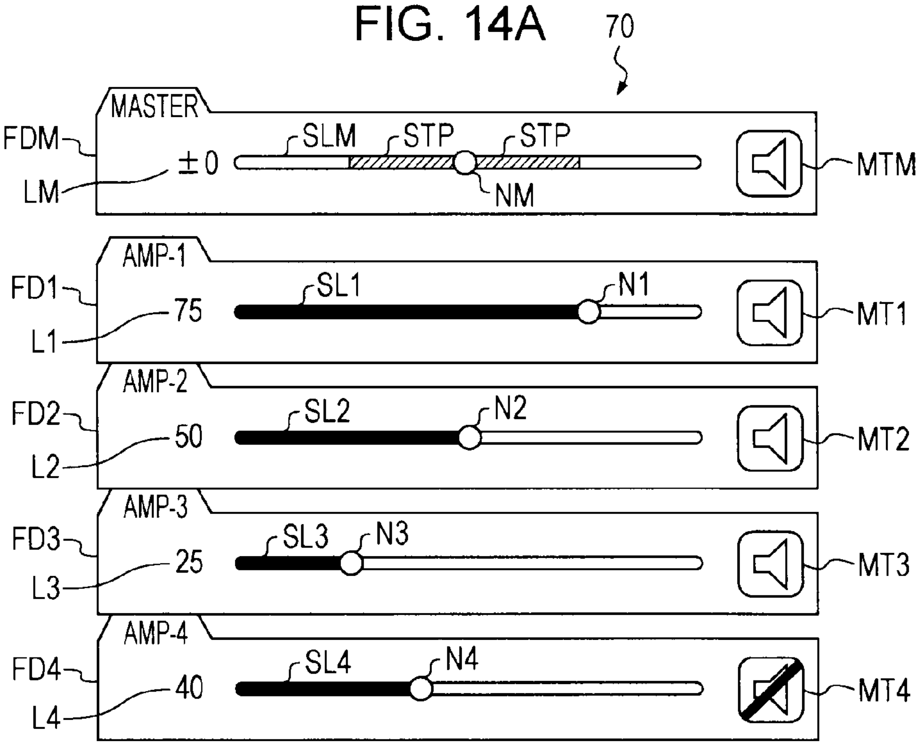
FIGS. 14A and 14B are explanatory diagrams illustrating mute operations according to the embodiment.

FIG. 14A shows a state in which the user tapped the mute button MT4 of the individual volume setting section FD4 in the state shown in FIG. 7B.

In accordance with the tap of the mute button MT4, the controller 41 performs a process of transmitting a control command used to instruct a mute operation to the network speaker 2D corresponding to the individual volume setting section FD4. The controller 21 of the network speaker 2D performs mute (sound deadening) control on the amplifying unit 26 in accordance with a reception of the control command. That is, the controller 21 causes the speaker unit 27 to stop outputting sound. Note that, here, the volume settings are not changed to zero but the audio output is stopped while the volume settings are maintained.

Furthermore, the controller 41 of the remote controller 3 changes display of the mute button MT4 in the individual volume setting section FD4 to display which represents the mute state as shown in FIG. 14A.

Also when the other mute buttons MT1 to MT3 are tapped, the controller 41 similarly performs the transmission of the control command to the audio output apparatuses corresponding to the mute buttons MT1 to MT3 and performs change of the display of the mute buttons MT1 to MT3.

Figure 14B:
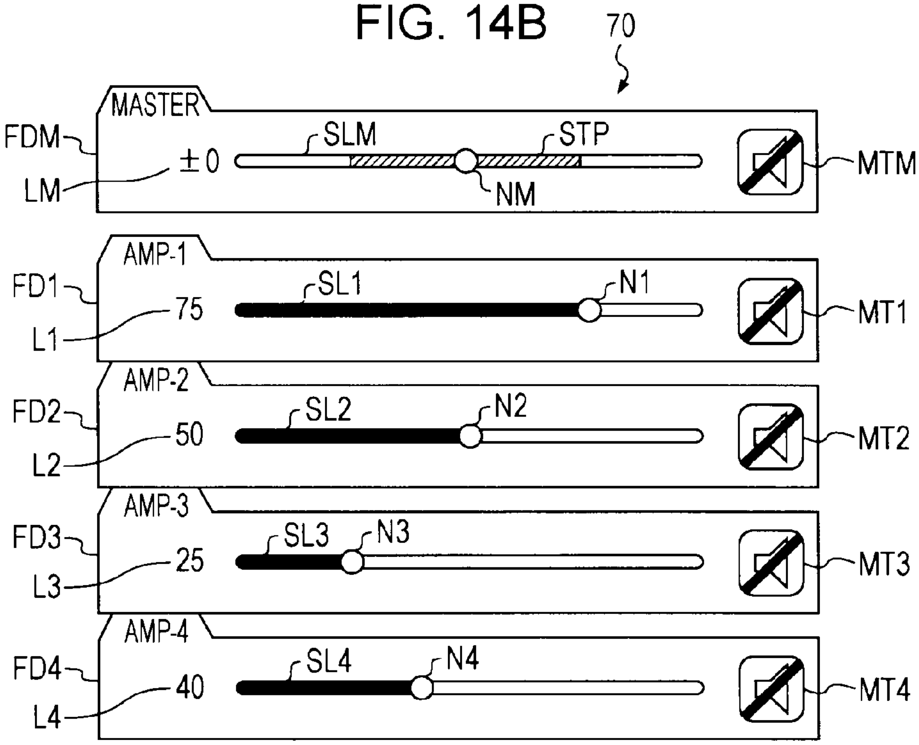

FIG. 14B shows a case where the mute button MTM of the master volume setting section FDM is tapped. In this example, when the mute button MTM of the master volume setting section FDM is operated, mute operations of all the audio output apparatuses are performed.

That is, the controller 41 performs a process of transmitting a control command which instructs a mute operation to the reproducing apparatus 1 and the network speaker 2B, 2C, and 2D which correspond to the individual volume setting sections FD1 to FD4, respectively. By this, in all the audio output apparatuses, mute processes of stopping audio outputs is performed while the volume settings are not changed.

Furthermore, the controller 41 changes the display of the mute button MTM and the mute buttons MT1 to MT4 back to display representing that the mute states are entered as shown in FIG. 14B.

Note that the mute buttons MT1 to MT4 of the individual volume setting sections FD1 to FD4 are individually tapped, and accordingly, all the audio output apparatuses (the reproducing apparatus 1 and the network speaker 2B, 2C, and 2D) are muted, the mute button MTM of the master volume setting section FDM is preferably changed to display of a mute state. That is, a state shown in FIG. 14B is obtained.

On the other hand, when the mute state is to be cancelled, the user taps a mute button in a mute state.

For example, when the user taps the mute button MT4 of the individual volume setting section FD4 in the state shown in FIG. 14A, the mute state of the network speaker 2D is cancelled.

In accordance with the tap of the mute button MT4 performed to cancel the mute state, the controller 41 performs a process of transmitting a control command used to instruct cancel of a mute operation to the network speaker 2D corresponding to the individual volume setting section FD4. The controller 21 of the network speaker 2D cancels the mute state of the amplifying unit 26 in accordance with a reception of the control command. By this, the speaker unit 27 restarts audio output in a level corresponding to a current volume setting.

Furthermore, the controller 41 of the remote controller 3 changes display of the mute button MT4 in the individual volume setting section FD4 back to display which represents the normal state as shown in FIG. 7B.

Also when the other mute buttons MT1 to MT3 are tapped in mute states, the controller 41 similarly performs the transmission of the control command for cancelling the mute states to the audio output apparatuses corresponding to the mute buttons MT1 to MT3 and performs change of the display of the mute buttons MT1 to MT3.

Furthermore, when all the audio output apparatuses are in the mute states as shown in FIG. 14B and the mute button MTM of the master volume setting section FDM is displayed in the mute state, the mute states are collectively cancelled by tapping the mute button MTM.

That is, when the mute button MTM of the master volume setting section FDM is operated in the state shown in FIG. 14B, the controller 41 performs a process of transmitting a control command which instructs cancel of the mute states to the reproducing apparatus 1 and the network speaker 2B, 2C, and 2D which correspond to the individual volume setting sections FD1 to FD4, respectively. By this, the individual audio output apparatuses restart audio output using current volume settings.

Furthermore, the controller 41 changes the display of the mute button MTM and the mute buttons MT1 to MT4 back to the display representing the normal states as shown in FIG. 7B.

Note that, as shown in FIGS. 14A and 14B, even when some or all of the audio output apparatuses are in the mute states, for example, user's operations using the master knob NM and the knobs N1 to N4 are available. That is, in accordance with a knob slide operation performed by the user, the volume settings of the individual audio output apparatuses or the entire volume setting may be changed. In this case, the changed volume settings are reflected to output sound after the mute states are cancelled.

7. Operation of Exceeding Setting Changeable Range

Here, the case where the stopper STP is displayed relative to the master knob NM so as to clearly represent the setting changeable range in the master volume setting section FDM and the master knob NM is slidable only within the range in which the volume balance is maintained has been described.

However, it is not necessarily the case that the slidable range of the master knob NM is restricted in this way.

For example, some users may desire to operate the master knob NM while the volume balance is constantly maintained and may desire to perform the collective operation using the master knob NM while deterioration of the volume balance is accepted in some cases.

Therefore, the master knob NM may be also operated beyond the setting changeable range.

For example, a mode in which an operation should be performed within the setting changeable range and a mode in which an operation of the master knob NM is allowed to be performed beyond the setting changeable range while the setting changeable range is displayed (the stopper STP is displayed) may be switched from one to another in accordance with a setting of an operation mode selected by the user.

Alternatively, an operation performed by the user on the master knob NM may not be restricted within the setting changeable range without especially performing the mode switching. In this case, the display of the setting changeable range using the stopper STP or the like functions as guide display representing an operation range in which the volume balance is not deteriorated.

Furthermore, when the operation beyond the setting changeable range which was set at the beginning is allowed to be performed, the stopper STP represents a range which enables the master knob NM to be operated while the balance of the volumes of audio output apparatuses other than audio output apparatuses having volume settings which reach upper or lower limits is maintained.

By this, the fact that the master knob NM is allowed to be slid beyond the setting changeable range determined at the beginning may be clearly displayed for the user.

Figure 15A:
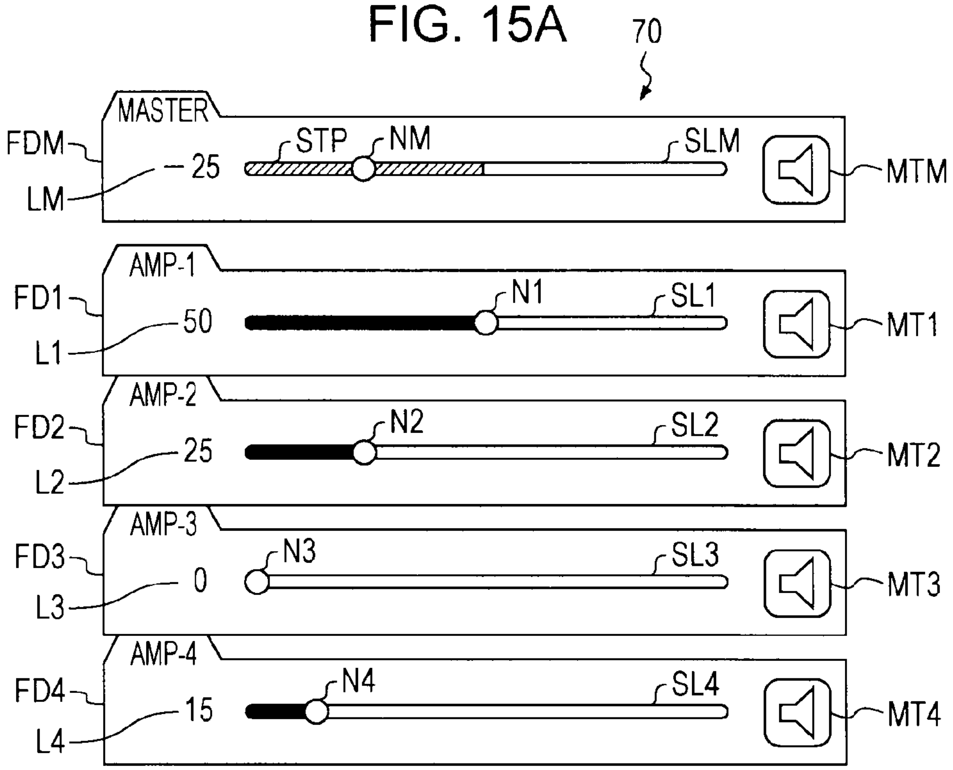
FIGS. 15A and 15B are explanatory diagrams illustrating operations of exceeding the setting changeable range according to the embodiment.

FIG. 15A shows a state in which the user slides the master knob NM leftward to a position corresponding to "−25" from the state shown in FIG. 7B.

This represents a state in which the master knob NM is moved to the operation lower limit while the volume balance of the reproducing apparatus 1 and the network speaker 2B, 2C, and 2D is maintained. In this case, the volume setting of the individual volume setting section FD3 reaches a level of "0". If the stopper STP is displayed as shown in FIG. 15A, it is difficult for the user to recognize that the master knob NM may be operated further leftward.

Therefore, the stopper STP is displayed such that the balance of the volumes of the individual volume setting sections FD1, FD2, and FD4 may be maintained while the individual volume setting section FD3 which reached the lower limit is excepted.

That is, when the individual volume setting section FD3 is excepted in the state shown in FIG. 15A, the highest level corresponds to a level of "50" of the individual volume setting section FD1 and the lowest level corresponds to a level of "15" of the individual volume setting section FD4. Therefore, as shown in FIG. 16B, the display of the stopper STP (and the position of the master knob NM) is changed so that the stopper STP is displayed so as to correspond to a range from the level "15" to the level "50".

When the display of the stopper STP is switched as described above, it is easy for the user to recognize that the master knob NM is slidable further leftward.

Figure 15B:
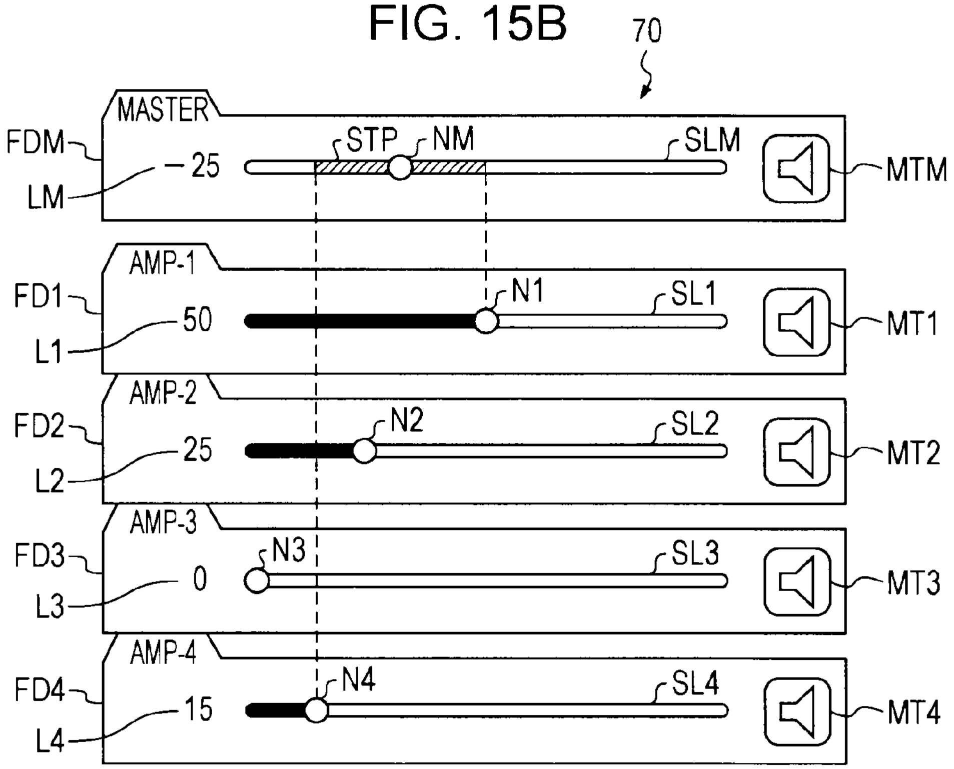
Figure 16A:
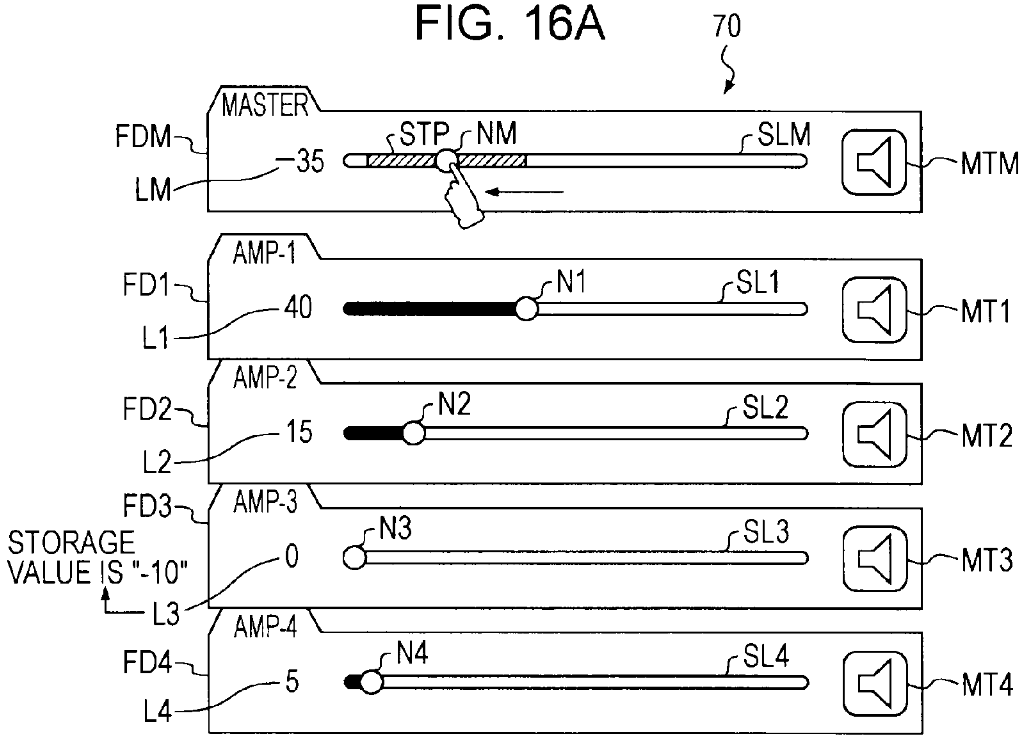
FIGS. 16A and 16B are explanatory diagrams illustrating other operations of exceeding the setting changeable range according to the embodiment.
Figure 16B:
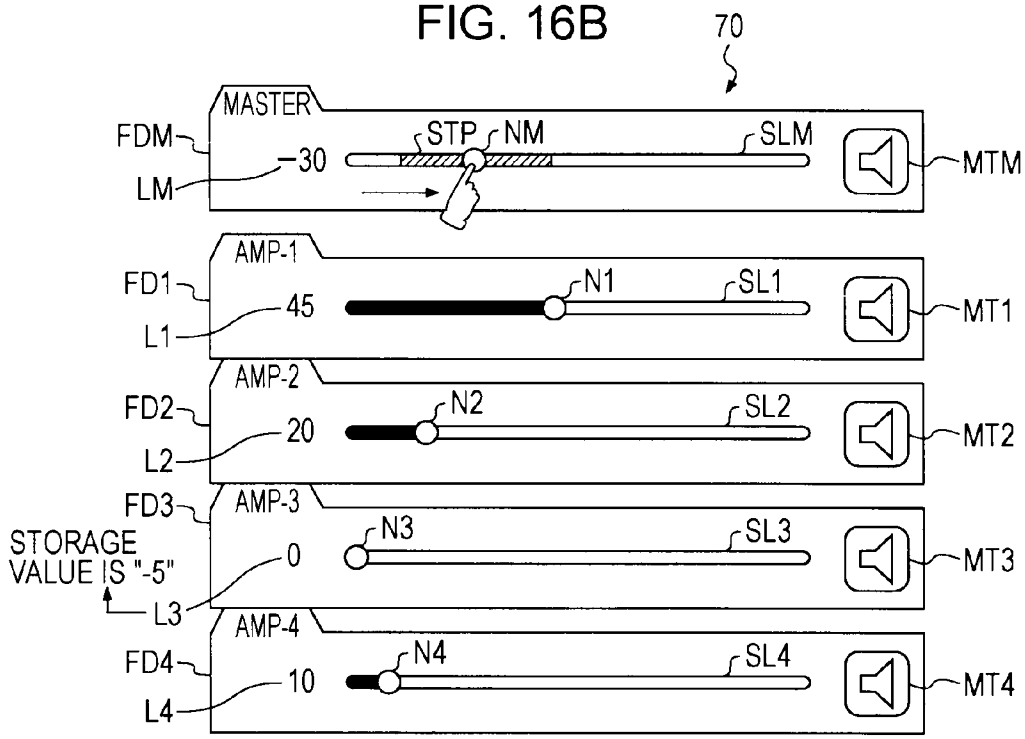

FIG. 16A shows a state in which the user slides the master knob NM further leftward to a position corresponding to a level of "−35" from the state shown in FIG. 15B.

When an operation of the master knob NM reaches the state shown in FIG. 15B, the volume setting of the individual volume setting section FD3 reaches a level of "0". Accordingly, an output volume of the network speaker 2C is zero and is not further turned down.

Therefore, when the master knob NM is further slid leftward, the volume of the network speaker 2C is not changed (remains as the level of "0") and the balance of the volumes of the four audio output apparatuses (the reproducing apparatus 1 and the network speaker 2B, 2C, and 2D) is deteriorated.

However, the master knob NM may be operated as shown in FIG. 16A while the deterioration of the volume balance is accepted. When the master knob NM is moved to a position corresponding to the level of "−35", the individual volume setting sections FD1, FD2, and FD4 represent levels of "40", "15", and "5", respectively, and the reproducing apparatus 1 and the network speakers 2B and 2D are controlled to the corresponding levels.

The level of the individual volume setting section FD3 has been "0" when the operation is performed to the state shown in FIG. 15B, and the position of the knob N3 and the display of the numerical-value display section L3 after the state in FIG. 15B remain as "0" also in FIG. 16A.

It is apparent that the master knob NM may be slid further leftward from the state shown in FIG. 16A, and as a result, the operation may be continued until all the audio output apparatuses reach the level of "0".

By performing the operation while the volume balance is not maintained, the audio outputs of all the audio output apparatuses may be faded out.

Furthermore, although not shown, all the audio output apparatuses may be controlled so as to be gradually close to a level of "100" by sliding the master knob NM rightward from the state shown in FIG. 7B.

On the other hand, volumes of all the audio output apparatuses may be gradually turned up by conversely sliding the master knob NM rightward from the state shown in FIG. 16A or the state in which the master knob NM is being slid leftward. In this case, as a result, the previous volume balance shown in FIG. 7B, for example, is obtained again.

Therefore, the controller 41 virtually stores the volume setting values of the audio output apparatuses in which the levels thereof reached the upper or lower limit.

For example, in the state shown in FIG. 15B, a volume setting value of the individual volume setting section FD3 is "0". Then, as shown in FIG. 16A, even when the master knob NM is operated further leftward, the volume setting value of the network speaker 2C represented by the individual volume setting section FD3 is not changed, that is, "0" which is the smallest value. Note that the controller 41 does not change the volume setting value of the individual volume setting section FD3 from "0" in the display and virtually stores a value corresponding to the operation of the master knob NM.

For example, in the state shown in FIG. 16A, the master knob NM is operated to the level of "−35". This means that the value of the individual volume setting section FD3 is changed from the level of "25" shown in FIG. 7B by the level of "−35", and therefore, a value "−10" is stored as a virtual volume setting value of the individual volume setting section FD3.

Thereafter, it is assumed that the user moves the master knob NM back to a position corresponding to the level of "−30" rightward by five levels as shown in FIG. 16B from the state shown in FIG. 16A.

The levels represented by the individual volume setting sections FD1, FD2, and FD4 correspond to "45", "20", and "10", respectively, and the reproducing apparatus 1 and the network speaker 2B and 2D are controlled to the corresponding levels.

The controller 41 sets the volume setting value of the individual volume setting section FD3 to "−10+5" and stores "−5" in accordance with the fact that the entire level is increased by five. Although the state shown in FIG. 16B is obtained, "0" is still displayed.

In accordance with the rightward operation of the master knob NM, the volume setting value of the individual volume setting section FD3 is changed to "−4", "−3", "−2", and so on, and when the state shown in FIG. 15B is reached, the virtual volume setting value corresponds to "0" which coincides with the display of the volume setting value.

Thereafter, in accordance with the further rightward operation of the master knob NM, the volume setting value of the individual volume setting section FD3 is changed to "1", "2", "3", and so on. In this case, in actual display, that is, the numerical-value display section L3 and the position of the knob N3 are changed in accordance with the volume setting value and a command for controlling the volume setting value is transmitted to the network speaker 2C.

Accordingly, when the volume setting value which has reached the lower limit exists and an operation of lowering the setting of the master knob NM is performed, the volume setting value of the audio output apparatus which has reached the lower limit is virtually stored as a negative value. This is reflected to an actual volume control after the setting value represents a positive value by operating the master knob NM afterward while the volumes of all the audio output apparatuses are turned up.

As a result, when the operation of the master knob NM is consecutively performed, for example, the volumes of the individual audio output apparatuses are turned up in the original volume balance state shown in FIG. 7B.

That is, the turning up of the volumes of all the audio output apparatuses is performed as a fade-in operation, and at this time, the original volume balance may be restored.

Note that although the process performed after a volume setting value of a certain individual volume setting section has reached a lower limit has been described as an example hereinabove, a process performed after a volume setting value of a certain individual volume setting section has reached a higher limit may be similarly performed.

8. Processing Example

The user operation, the transmission of a control command, and the switching of display using the volume operation display 70 of the remote controller 3 have been described hereinabove.

Here, an example of a process of realizing the operations described above performed by the controller 41 of the remote controller 3 will be described with reference to FIGS. 17 and 18.

Figure 17:
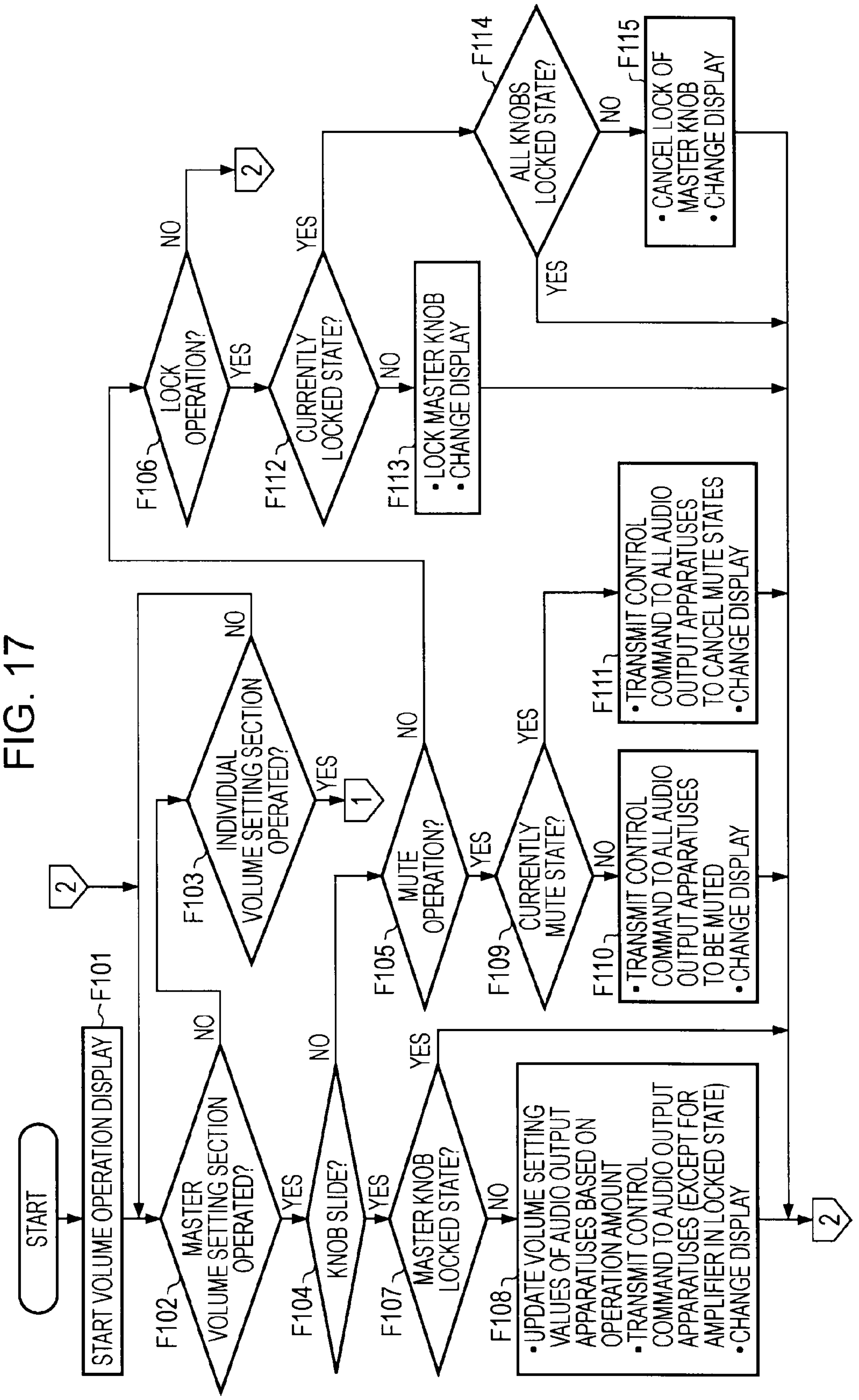
FIG. 17 is a flowchart illustrating an operation-correspondence process according to the embodiment.
Figure 18:
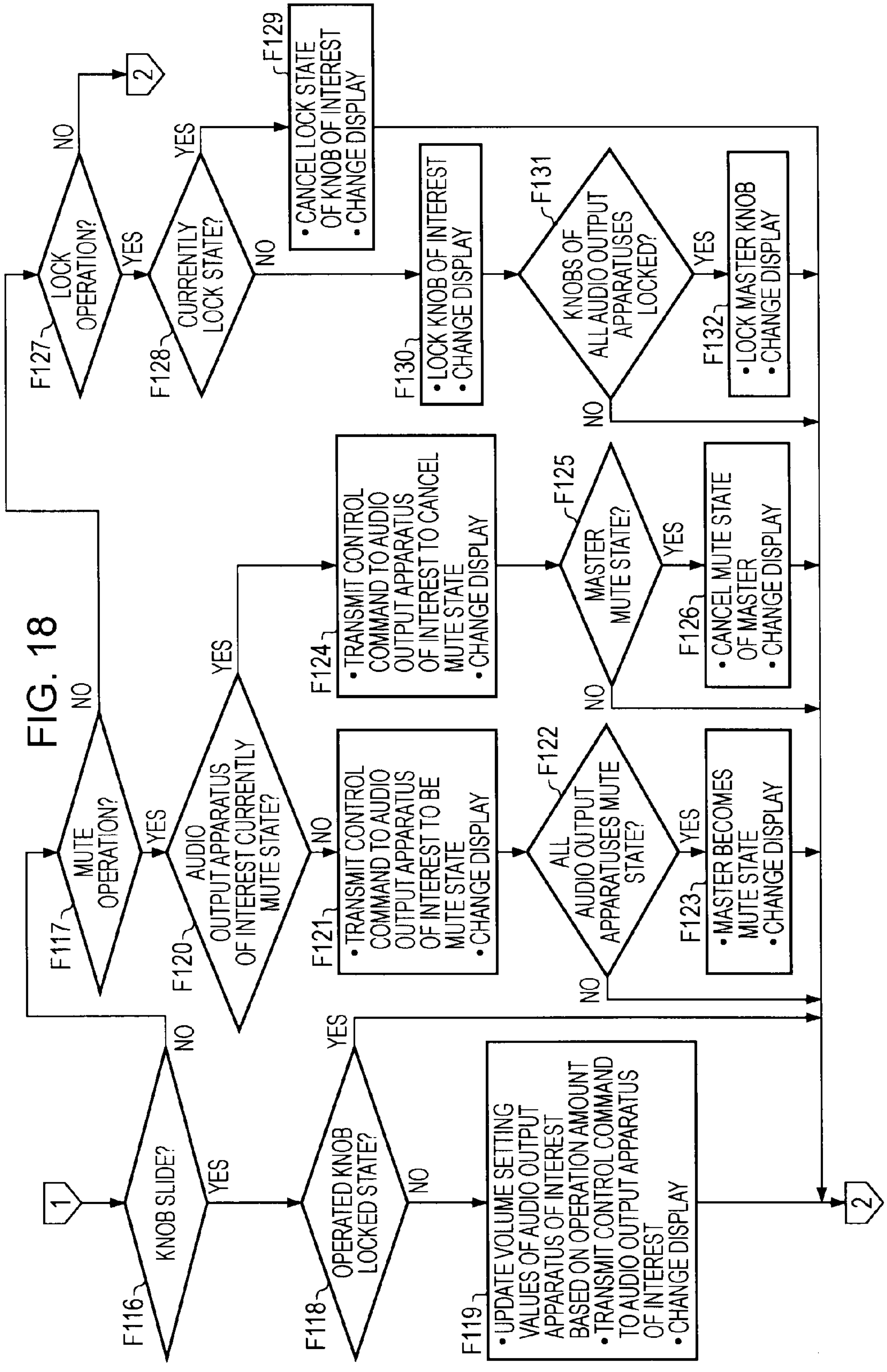
FIG. 18 is a flowchart illustrating the operation-correspondence process according to the embodiment.

The process shown in FIGS. 17 and 18 shows an example of a process performed by the controller 41 when the volume operation display 70 is displayed in the display unit 45.

Step F101 of FIG. 17 includes a process of starting display of the volume operation display 70 in the display unit 45 as shown in FIG. 6.

After the volume operation display 70 is displayed in step F101, the controller 41 monitors a touch operation performed by the user on the master volume setting section FDM or one of the individual volume setting sections FD1 to FD4 in step F102 and step F103.

When detecting the touch operation performed on the master volume setting section FDM, the controller 41 branches the process into step F104, step F105, and step F106 in accordance with a type of the operation.

As described above, examples of the operation of the master volume setting section FDM include the operation of sliding the master knob NM, the operation of the mute button MTM, and the lock operation (an operation of tapping the master knob NM).

When detecting the operation of sliding the master knob NM performed by the user, the controller 41 proceeds from step F104 to step F107 where it is determined whether the master knob NM is currently set to a locked state (operation unavailable).

If the master knob NM is currently in the locked state, it is determined that the detected slide operation performed by the user is invalid, an operation for the operation is not particularly performed, and the process returns to the monitoring loop including step F102 and step F103.

When the master knob NM is not in the locked state, the controller 41 proceeds to step F108 where a process corresponding to the user's operation is performed.

First, the volume setting values of the audio output apparatuses are updated in accordance with an amount (and a direction) of the slide operation. Then, control commands representing the updated audio setting values are transmitted to the individual audio output apparatuses (the reproducing apparatus 1 and the network speaker 2B, 2C, and 2D).

Furthermore, display change control is performed in accordance with the operation of sliding the master knob NM. Specifically, change of the positions of the knobs and the display position of the stopper STP and change of the numerical value of the numerical-value display section LM are performed. Furthermore, moving of the positions of the knobs N1 to N4 in the individual volume setting sections FD1 to FD4 and change of the numerical values of the numerical-value display sections L1 to L4 are performed in accordance with the slide of the master knob NM.

Note that, when some of the knobs N1 to N4 of the individual volume setting sections FD1 to FD4 are in locked states, the change of display is not performed on the locked individual volume setting sections and a control command for updating the volume setting values is not transmitted to the corresponding audio output apparatuses.

Furthermore, as described above, in the case where the operation of the master knob NM performed beyond a limit in which the balance among the volumes of the four audio output apparatuses is not deteriorated is accepted, the controller 41 may execute display change, update of a virtual volume setting value, and a storage process as described with reference to FIGS. 15A, 15B, 16A, and 16B in step F108.

When the master knob NM is slid, the controller 41 performs the process in step F108 before returning to the monitoring loop including step F102 and step F103.

When detecting the operation of tapping the mute button MTM, the controller 41 proceeds from step F105 to step F109. Then, first it is determined whether the mute button MTM is in a mute state, that is, it is determined whether all the audio output apparatuses are in mute states.

When the mute state is not currently entered, the tap operation which is performed by the user and which is detected this time is recognized as a mute operation and a mute process is performed in step F110. Specifically, the controller 41 transmits a control command representing a mute instruction to the individual audio output apparatuses (the reproducing apparatus 1 and the network speaker 2B, 2C, and 2D). Note that, when at least one of the audio output apparatuses has been set to a mute state, a mute command is not transmitted to the audio output apparatus.

Furthermore, the controller 41 controls display change of the mute button MTM and the mute buttons MT1 to MT4. Specifically, the controller 41 changes display of the mute button MTM and the mute buttons MT1 to MT4 to display representing the mute states as shown in FIG. 14B.

After performing the mute process in step F110, the controller 41 returns to the monitoring loop including step F102 and step F103.

On the other hand, when it is determined that the mute state is currently entered in step F109, the controller 41 recognizes that the tap operation which is performed by the user and which is detected this time corresponds to a mute cancel operation and performs a mute cancel process in step F111.

Specifically, the controller 41 transmits a command used to cancel the mute states to the audio output apparatuses (the reproducing apparatus 1 and the network speaker 2B, 2C, and 2D).

Furthermore, the controller 41 performs control of the display change of the mute button MTM and the mute buttons MT1 to MT4. Specifically, the controller 41 performs control such that the display of the mute button MTM and the mute buttons MT1 to MT4 is returned from the state shown in FIG. 14B to the normal state shown in FIG. 7B.

After the mute cancel process is performed in step F111, the controller 41 returns to the loop operation including step F102 and step F103.

When detecting the lock operation (the operation of tapping the master knob NM) performed by the user, the controller 41 proceeds from step F106 to step F112 where it is determined whether the master knob NM is currently in a locked state (operation unavailable state).

When the locked state is not currently entered, the tap operation which is performed by the user and which is detected this time is recognized as a lock operation and a lock process is performed in step F113. That is, the controller 41 bans the operation of sliding the master knob NM. Furthermore, the master knob NM is displayed as a locked state and performs control of displaying of the numerical-value display section LM as an inactive state whereby a locked state is displayed for the user.

Then, the process returns to the monitoring loop including step F102 and step F103.

Since the locked state is entered in step F113, even when the operation of sliding the master knob NM is detected afterward, the operation is determined to be invalid in step F107 as described above.

When it is determined that the locked state is currently entered in step F112, the controller 41 recognizes that the tap operation which is performed by the user and which is detected this time corresponds to a lock cancel operation and the process proceeds to step F114. Here, the controller 41 determines whether all the knobs N1 to N4 of the individual volume setting sections FD1 to FD4 are in locked states.

In this embodiment, when all the knobs N1 to N4 are in the locked states, the master knob NM is also in a locked state. In other words, when all the knobs N1 to N4 are in the locked states, the master knob NM automatically enters the locked state.

Therefore, when all the knobs N1 to N4 are in the locked states, even if the lock cancel operation is performed on the master knob NM, the locked state of the master knob NM is not cancelled.

Accordingly, when all the knobs N1 to N4 are in the locked states in step F114, the lock cancel operation performed on the master knob NM is determined to be invalid and the process returns to the monitoring loop including step F102 and step F103.

Furthermore, when it is determined that at least one of all the knobs N1 to N4 is not in the locked state in step F114, the master knob NM accepts the lock cancel operation. Therefore, the controller 41 proceeds to step F115 where the lock cancel process is performed. That is, the controller 41 cancels the slide-operation unavailable state of the master knob NM. Furthermore, control of display of the master knob NM and the numerical-value display section LM in normal states are performed and the cancel of the locked states is displayed for the user. Then, the process returns to the monitoring loop including step F102 and step F103.

When the user's operation is performed on one of the individual volume setting sections FD1 to FD4, the process of the controller 41 proceeds from step F103 to the process shown in FIG. 18 and the controller 41 branches the process into step F116, step F117, and step F127 in accordance with a type of the operation.

As described above, the operations of the individual volume setting sections FD1 to FD4 include operations of sliding the knobs N1 to N4, operations of the mute buttons MT1 to MT4, and lock operations (operations of tapping the knobs N1 to N4).

Note that hereinafter "x" represents one of "1" to "4". For example, "Nx" represents one of the knobs N1 to N4 which is operated, "Lx" represents one of the numerical-value display sections L1 to L4, and "MTx" represents one of the mute buttons MT1 to MT4 which is operated.

When detecting the operation of sliding a knob Nx performed by the user, the controller 41 proceeds from step F116 to step F118 where first it is determined whether the operated knob Nx has been set in a locked state (operation unavailable).

If the knob Nx is currently in the locked state, it is determined that the detected slide operation performed by the user is invalid, an operation for the operation is not particularly performed, and the process returns to the monitoring loop including step F102 and step F103 shown in FIG. 17.

When the operated knob Nx is not in the locked state, the controller 41 proceeds to step F119 where a process corresponding to the user's operation is performed.

First, the volume setting value of a corresponding one of the audio output apparatuses is updated in accordance with an amount (and a direction) of the slide operation. Then, a control command which represents the updated audio setting value is transmitted to the corresponding one of the audio output apparatuses (the reproducing apparatus 1 and the network speaker 2B, 2C, and 2D).

Furthermore, display change control is performed in accordance with the operation of sliding the knob Nx. Specifically, change of the position of the knob and change of the numerical value of the numerical-value display section Lx are performed in accordance with the slide of the knob Nx.

Furthermore, by moving the knob Nx, the range of the stopper STP and the position of the master knob NM in the master volume setting section FDM may be changed as described with reference to FIGS. 12A and 12B. In this case, display change control for the stopper STP and the master knob NM is also performed. Note that when the example of the display of the setting changeable range shown in FIGS. 10 and 11 is employed, instead of the display change of the stopper STP, display of a non-slidable region, display of the slider length, and change of the size of the master knob NM may be performed by the controller 41.

When the knob Nx is slid, the controller 41 performs the process in step F119 before returning to the monitoring loop including step F102 and step F103.

When detecting the operation of tapping a mute button MTx performed by the user, the controller 41 proceeds from step F117 to step F120. First, it is determined whether the mute button MTx is in a mute state, that is, it is determined whether a corresponding one of the audio output apparatuses is in a mute state.

When the mute state is not currently entered, the tap operation which is performed by the user and which is detected this time is recognized as a mute operation and a mute process is performed in step F121. Specifically, the controller 41 transmits a control command representing a mute instruction to the one of the audio output apparatuses (the reproducing apparatus 1 and the network speaker 2B, 2C, and 2D) corresponding to the mute button MTx.

Furthermore, the controller 41 performs control of the display change of the mute button MTx. Specifically, the controller 41 changes display of the mute button MTx to display representing the mute state similarly to the mute button MT4 shown in FIG. 14A.

After the mute process is performed on the certain audio output apparatus, the controller 41 determines whether all the audio output apparatuses are in mute states at the time in step F122. In this example, when all the audio output apparatuses enter the mute states, the mute button MTM of the master volume setting section FDM automatically enters a mute state. Therefore, when all the audio output apparatuses enter the mute states, the controller 41 proceeds to step F123 where the mute button MTM of the master volume setting section FDM is brought to a mute state. That is, a state shown in FIG. 14B is obtained. Then, the process returns to the monitoring loop including step F102 and step F103.

In addition, when at least one of the audio output apparatuses is not in the mute state, the mute button MTM of the master volume setting section FDM is not processed and the process returns from step F122 to the monitoring loop including step F102 and step F103.

On the other hand, when it is determined that the audio output apparatus corresponding to the operated mute button MTx is currently in the mute state in step F120, the controller 41 recognizes that the tap operation which is performed by the user and which is detected this time corresponds to a mute cancel operation and performs a mute cancel process in step F124.

That is, the controller 41 transmits a command used to cancel the mute state to the audio output apparatus corresponding to the mute button MTx.

Furthermore, the controller 41 performs control such that display of the mute button MTx is returned to a normal state.

After the mute cancel process is performed in step F124, the controller 41 checks the state of the mute button MTM of the master volume setting section FDM in step F125.

In this example, a case where the mute button MTM of the master volume setting section FDM enters a mute state corresponds to the state in step F123 and the state in step F110 described above. Therefore, when all the audio output apparatuses enter the mute states or when all the audio output apparatuses are to enter the mute states, the mute button MTM of the master volume setting section FDM is also brought to the mute state.

The mute state of the mute button MTM is automatically cancelled when at least one of the mute states of the individual volume setting sections FD1 to FD4 is cancelled.

Therefore, when the mute button MTM of the master volume setting section FDM is in the mute state in step F125, a process of cancelling the mute state of the mute button MTM of the master volume setting section FDM is performed in step F126 in response to the cancel of the mute state performed this time in step F124. Then, the process returns to the monitoring loop including step F102 and step F103.

Note that, when the mute button MTM of the master volume setting section FDM is not in the mute state in step F125, the process returns to the monitoring loop including step F102 and step F103 from step F125.

When detecting the lock operation (the operation of tapping the knob Nx) performed by the user, the controller 41 proceeds from step F127 to step F128 where it is determined whether the knob Nx is currently in a locked state (operation unavailable state).

When the locked state is not currently entered, the tap operation which is performed by the user and which is detected this time is recognized as a lock operation and a process of locking the knob Nx is performed in step F130. That is, the controller 41 bans the operation of sliding the knob Nx. Furthermore, the controller 41 performs control such that the knob Nx is displayed as a locked state and a numerical-value display section Lx is displayed as an inactive state, and shows the locked state to the user.

Furthermore, as described above, in this example, when all the knobs N1 to N4 enter the locked state, the master knob NM automatically is brought to the locked state. Therefore, the controller 41 determines whether all the knobs N1 to N4 of the individual volume setting sections FD1 to FD4 have entered the locked state by the lock process performed this time in step F130. When all the knobs N1 to N4 enter the locked state, the controller 41 proceeds to step F132 where the master knob NM is brought to a locked state and performs control of display of the locked state of the master knob NM and display of the inactive state of the numerical-value display section LM. Then, the process returns to the monitoring loop including step F102 and step F103.

When at least one of the knobs is not in a locked state in step F131, the process in step F132 is not performed and the process returns to the monitoring loop including step F102 and step F103.

When it is determined that the master knob NM is currently in the locked state in step F128, the controller 41 recognizes that the tap operation which is performed by the user and which is detected this time corresponding to an unlock operation and the process proceeds to step F129. Then, the controller 41 cancels the state in which the operation of sliding the knob Nx is banned. Furthermore, control of displaying the knob Nx and the numerical-value display section Lx in normal states is performed and the unlocked state is displayed for the user. Then, the process returns to the monitoring loop including step F102 and step F103.

By performing the process shown in FIGS. 17 and 18 using the controller 41 of the remote controller 3, the transmission of the control command and the display control described with reference to FIG. 6 to FIGS. 16A and 16B are executed in response to a touch operation performed by the user.

According to this embodiment, the user may perform the following operations using the remote controller 3.

First, the output volumes of the plurality of audio output apparatuses (the reproducing apparatus 1 and the network speaker 2B, 2C, and 2D) in the home network system, that is, the volumes in the rooms A to D may be individually controlled. Operations of the knobs N1 to N4 of the individual volume setting sections FD1 to FD4 enable this control.

Furthermore, the operations of the volumes of the audio output apparatuses may be banned and cancelled by the lock operations performed on the knobs N1 to N4.

Furthermore, the audio outputs may be temporarily stopped and the mute operations may be cancelled using the mute buttons MT1 to MT4 while the volume settings of the audio output apparatuses are not changed.

Furthermore, the audio settings of the audio output apparatuses may be collectively controlled by operating the master knob NM while the balance among the volumes of the audio output apparatuses is maintained.

Furthermore, in addition, even in a range in which the voltage balance is not maintained, the collective volume control may be performed by operating the master knob NM and collective fade-out, collective fade-in, and collective turning up of the volumes to the maximum may be performed, for example.

Furthermore, all the audio output apparatuses may be collectively brought to the mute states and the mute states may be cancelled by operating the mute button MTM of the master volume setting section FDM.

Furthermore, the user may normally check volume setting states of the audio output apparatuses using the volume operation display 70.

In this embodiment, such operations and such a check may be easily performed without using a mixer used in a PA system, or the like.

9. Modifications

The processing example illustrated in FIG. 6 to FIGS. 16A to 16B and described with reference to FIGS. 17 and 18 is merely an example, and various modifications are expected as described below, for example.

First, the lock of the knobs N1 to N4 may be simultaneously performed with the lock operation of the master knob NM.

Specifically, in step F113 of FIG. 17, not only the master knob NM is brought to the locked state, but also all the knobs N1 to N4 may be collectively brought to the locked states.

Furthermore, the determination performed in step F114 may be omitted, and in step F115, all the knobs N1 to N4 may be unlocked in response to the unlock of the master knob NM.

By this, collective lock/unlock may be performed by performing a lock/unlock operation of the master knob NM, which is convenient.

Furthermore, when the master knob NM is locked in a state in which all the knobs N1 to N4 are not locked as a result of the unlock of the knob Nx performed in step F129 shown in FIG. 18, the master knob NM may be also automatically unlocked.

Furthermore, when the master knob NM and the knobs N1 to N4 are in the locked states, not only the operation of the knobs but also the operation of the corresponding mute button MTM and the mute buttons MT1 to MT4 may be banned. In this case, an example of display in which all the master volume setting section FDM and the individual volume setting sections FD1 to FD4 are brought to inactive states may be considered.

Furthermore, in the numerical-value display section LM of the master volume setting section FDM, as an intermediate value (Vttl) between a value (Vmax) corresponding the maximum volume setting and a value (Vmin) corresponding to the minimum volume setting among the individual volume setting sections FD1 to FD4 to be controlled, a value which satisfies "Vttl=(Vmax+Vmin)/2" may be displayed.

For example, in FIG. 11, the value of the numerical-value display section LM is "50". This is an example in which an intermediate value (Vttl) obtained from the maximum value Vmax of 75 and the minimum value Vmin of 25 is displayed in the numerical-value display section LM.

The case where, in the master volume setting section FDM and the individual volume setting sections FD1 to FD4, the master knob NM and the knobs N1 to N4 are horizontally slid for the volume setting operations is described as an example. However, display examples of other operations such as an operation of vertical slide or an operation of rotating a dial-shape object may be employed.

It is apparent that various designs of the volume operation display 70 and various types of operation member may be employed. The designs and the types may be different depending on the number of audio output apparatuses on the network 4 and types of the audio output apparatuses.

Moreover, although the example of application of the present disclosure to a music-content delivery system has been described in this embodiment, the present disclosure may be applicable to other systems.

For example, as a control terminal apparatus included in a system which performs delivery and synchronization reproduction of video content, text, game data, and the like in a home network, an apparatus similar to the remote controller 3 in this embodiment may be expected.

Furthermore, in addition to content delivery systems, this embodiment may be applicable to electronic apparatuses connected to a network. For example, this embodiment is applicable as a control terminal apparatus in a system including a plurality of devices such as a television receiver set, a monitor display, and an information device which are connected to one another through a network.

Moreover, the application of the present disclosure is not limited to systems connected to networks. For example, the present disclosure is applicable as a control terminal apparatus such as a remote controller which may directly transmit a control command by infrared communication, radio communication, or wireless communication to a plurality of audio output apparatuses.

The present disclosure contains subject matter related to that disclosed in Japanese Priority Patent Application JP 2010-197529 filed in the Japan Patent Office on Sep. 3, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A control terminal apparatus comprising:

a transmitter configured to transmit and output a control signal to a plurality of audio output apparatuses;

a display; and circuitry configured to detect an operation associated with display content in the display, cause the display to display individual volume setting sections which correspond to the audio output apparatuses and which include operation members capable of performing variable operations of volume settings while volume setting states are displayed and to display a master volume setting section including an operation member capable of performing collective variable operation in a state in which the balance of volumes of volume setting states of the audio output apparatuses is maintained, execute display of a setting changeable range in which the volume balance of the audio output apparatuses is maintained in the master volume setting section, the setting changeable range being based on a volume setting state of at least one of the audio output apparatuses, generate, when the circuitry detects an operation performed on one of the individual volume setting sections or the master volume setting section, a control signal corresponding to content of the operation, and cause the transmitter to transmit and output the control signal.

2. The control terminal apparatus according to claim 1, wherein the circuitry causes the transmitter to transmit and output a control signal for changing the volume settings to the audio output apparatuses to control change of the volume settings in accordance with an operation performed on the operation member of the master volume setting section, and changes display of the volume setting states of the individual volume setting sections corresponding to the audio output apparatuses to which the volumes are set by the operation.

3. The control terminal apparatus according to claim 2, wherein display of the setting changeable range in the master volume setting section represents that the variable operation in the master volume setting section is available in a range in which the largest volume setting among the volume settings of the audio output apparatuses which are controlled in accordance with an operation performed on the master volume setting section does not exceed an upper limit of the setting changeable range and the smallest volume setting does not exceed a lower limit of the setting changeable range.

4. The control terminal apparatus according to claim 3, wherein the circuitry changes the display of the setting changeable range in the master volume setting section in accordance with the variable operation of the volume settings performed on the individual volume setting sections.

5. The control terminal apparatus according to claim 4, wherein the circuitry controls the master volume setting section so that the operation member of the master volume setting section is displayed at the center of the setting changeable range.

6. The control terminal apparatus according to claim 5, wherein the circuitry allows the operation member of the master volume setting section to be operated beyond the setting changeable range, and when a volume setting of one of the audio output apparatuses exceeds the upper limit or the lower limit of the setting changeable range, the volume setting is maintained to be the upper limit or the lower limit, and the volume setting state of the corresponding one of the individual volume setting section is maintained to be the upper limit or the lower limit of the setting changeable range, and on the other hand, control of change of volume settings is performed on individual volume setting sections in which volume settings thereof have not reached the upper limit or the lower limit of the setting changeable range, and display of an audio setting state of a corresponding one of the volume setting units is changed.

7. The control terminal apparatus according to claim 5, wherein the circuitry allows the operation member of the master volume setting section to be operated beyond the setting changeable range, and when a volume setting of one of the audio output apparatuses exceeds the upper limit or the lower limit of the setting changeable range, the volume setting is maintained to be the upper limit or the lower limit, and a volume setting value of the corresponding one of the individual volume setting sections is maintained to be a value which exceeds the setting changeable range in accordance with the operation while the volume setting state of the corresponding one of the individual volume setting sections is maintained to be the upper limit or the lower limit of the setting changeable range.

8. The control terminal apparatus according to claim 2, wherein the circuitry performs a process of prohibiting an operation performed on one of the operation members of the individual volume setting sections and the master volume setting section in accordance with a lock operation performed on the one of the individual volume setting sections and the master volume setting section.

9. The control terminal apparatus according to claim 8, wherein, when performing the prohibition process on some of the individual volume setting sections, the circuitry causes the transmitter to transmit and output a control signal for changing volume settings to audio output apparatuses corresponding to the other of the individual volume setting sections which have not been subjected to the prohibition process and changes display of volume setting states of the individual volume setting sections which have not been subjected to the prohibition process.

10. The control terminal apparatus according to claim 2, wherein the circuitry causes the transmitter to transmit and output, in accordance with a mute operation performed on at least one of the individual volume setting sections, a control signal for a mute instruction to at least one of the audio output apparatuses to be operated and displays a mute state in the individual volume setting section.

11. The control terminal apparatus according to claim 2, wherein the circuitry causes the transmitter to transmit and output, in accordance with a mute operation performed on the master volume setting unit, a control signal for a mute instruction to all the audio output apparatuses and displays mute states in the individual volume setting sections and the master volume setting section.

12. The control terminal apparatus according to claim 11, wherein the circuitry causes the transmitter to transmit and output, in accordance with a mute cancel operation performed on at least one of the individual volume setting sections, a control signal for a mute cancel instruction to an audio output apparatus corresponding to the individual volume setting section and terminates display of mute states in the individual volume setting section and the master volume setting section.

13. The control terminal apparatus according to claim 11, wherein the circuitry causes the transmitter to transmit and output, in accordance with a mute cancel operation performed on the master volume setting section, a control signal for a mute cancel instruction to all the audio output apparatuses and terminates the display of the mute states of all the individual volume setting section and the master volume setting section.

14. The control terminal apparatus according to claim 1, wherein the circuitry performs control such that the operation member is displayed so as to have a size corresponding to the setting changeable range so that the setting changeable range is clearly displayed.

15. The control terminal apparatus according to claim 1, wherein the audio output apparatuses are connected to a network including an audio source device and reproduce and output audio content delivered in common from the audio source device, and the transmitter transmits and outputs a control signal to the audio output apparatuses in communication through the network.

16. A control method of a control terminal apparatus including a transmitter configured to transmit and output a control signal to a plurality of audio output apparatuses;

a display, and circuitry configured to detect an operation associated with display content in the display, the control method comprising:

displaying individual volume setting sections which correspond to the audio output apparatuses and which include operation members capable of performing variable operations of volume settings while volume setting states are displayed, displaying a master volume setting section including an operation member capable of performing collective variable operation in a state in which the balance of volumes of volume setting states of the audio output apparatuses is maintained, and executing display of a setting changeable range in which the volume balance of the audio output apparatuses is maintained in the master volume setting section, the setting changeable range being based on a volume setting state of at least one of the audio output apparatuses, and generating, when the circuitry detects an operation performed on one of the individual volume setting sections or the master volume setting section, a control signal corresponding to content of the operation, and causing the transmitter to transmit and output the control signal.

* * * * *